(12) United States Patent
Yonemoto

(10) Patent No.: US 11,438,533 B2
(45) Date of Patent: Sep. 6, 2022

(54) SOLID-STATE IMAGING DEVICE, METHOD OF DRIVING THE SAME, AND ELECTRONIC APPARATUS

(71) Applicant: SONY SEMICONDUCTOR SOLUTIONS CORPORATION, Kanagawa (JP)

(72) Inventor: Kazuya Yonemoto, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/250,693

(22) PCT Filed: Aug. 16, 2019

(86) PCT No.: PCT/JP2019/032121
§ 371 (c)(1),
(2) Date: Feb. 19, 2021

(87) PCT Pub. No.: WO2020/045121
PCT Pub. Date: Mar. 5, 2020

(65) Prior Publication Data
US 2021/0185251 A1 Jun. 17, 2021

(30) Foreign Application Priority Data
Aug. 31, 2018 (JP) .............................. JP2018-163987

(51) Int. Cl.
*H04N 5/355* (2011.01)
*H04N 5/369* (2011.01)
(Continued)

(52) U.S. Cl.
CPC ........... *H04N 5/3559* (2013.01); *H04N 5/361* (2013.01); *H04N 5/3698* (2013.01); *H04N 5/374* (2013.01); *H04N 5/378* (2013.01)

(58) Field of Classification Search
CPC .... H04N 5/3559; H04N 5/361; H04N 5/3698; H04N 5/374; H04N 5/378;
(Continued)

(56) References Cited

U.S. PATENT DOCUMENTS 9,807,330 B2 * 10/2017 Aoki ................. H01L 27/14645
10,791,292 B1 * 9/2020 Geurts ................... H04N 5/379
(Continued)

FOREIGN PATENT DOCUMENTS

GB 2487740 A 8/2012

OTHER PUBLICATIONS

International Search Report and Written Opinion of PCT Application No. PCT/JP2019/032121, dated Oct. 21, 2019, 06 pages of ISRWO.

(Continued)

*Primary Examiner* — Sinh Tran
*Assistant Examiner* — Zhenzhen Wu
(74) *Attorney, Agent, or Firm* — Chip Law Group

(57) ABSTRACT

The present technology relates to a solid-state imaging device, a method of driving the same, and an electronic apparatus. The solid-state imaging device includes a pixel having a photodiode that performs photoelectric conversion on incident light, and a driving control unit configured to control driving of the pixel. The pixel stores a first charge generated by the photoelectric conversion in the photodiode and stores a second charge generated by the photoelectric conversion in a first capacitor provided in a pixel separation portion. The driving control unit causes a pixel signal due to the second charge stored in the first capacitor to be output and then a pixel signal due to the first charge stored in the photodiode to be output. The present technology may be applied, for example, to a solid-state imaging device or the like that detects both electrons and holes to perform high dynamic range imaging.

17 Claims, 18 Drawing Sheets

(51) Int. Cl.
  *H04N 5/361*     (2011.01)
  *H04N 5/374*     (2011.01)
  *H04N 5/378*     (2011.01)

(58) Field of Classification Search
  CPC ............ H04N 5/37452; H04N 5/35572; H01L 27/14643; H01L 27/14612; H01L 27/1463; H01L 27/1464
  See application file for complete search history.

(56) References Cited

U.S. PATENT DOCUMENTS

| | | | |
|---|---|---|---|
| 2007/0290238 A1* | 12/2007 | Adachi | H01L 27/14609 257/288 |
| 2012/0193516 A1 | 8/2012 | Bogaerts | |
| 2014/0284712 A1* | 9/2014 | Ujiie | H01L 29/7833 257/335 |
| 2016/0104733 A1* | 4/2016 | Sato | H04N 5/3559 250/208.1 |
| 2017/0186806 A1 | 6/2017 | Lalanne et al. | |
| 2019/0124278 A1* | 4/2019 | Velichko | H04N 5/35581 |
| 2019/0373168 A1* | 12/2019 | Balar | H01L 25/167 |
| 2020/0260025 A1* | 8/2020 | Seo | H04N 5/3559 |

OTHER PUBLICATIONS

Lalanne, et al., "A 750 K Photocharge Linear Full Well in a 3.2 μm HDR Pixel with Complementary Carrier Collection", Journal of MDPI, Sensors 2018, 13 pages, URL: https://www.ncbi.nlm.nih.gov/pmc/articles/PMC5795888/.

* cited by examiner

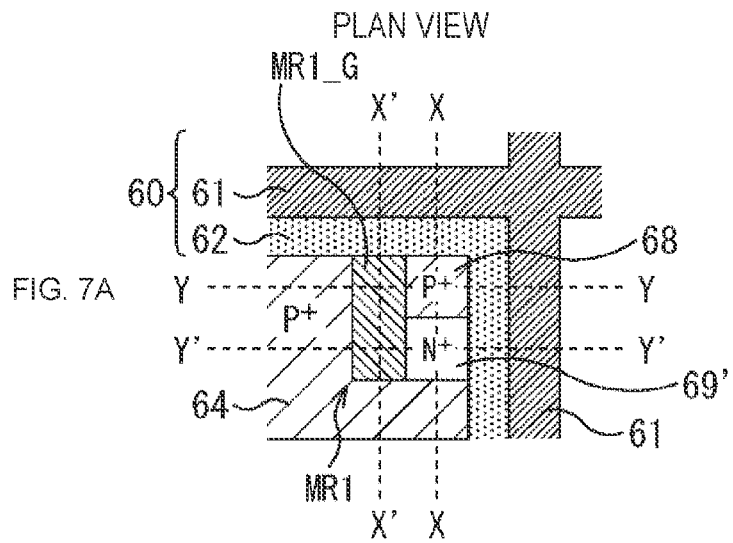
FIG. 7A PLAN VIEW
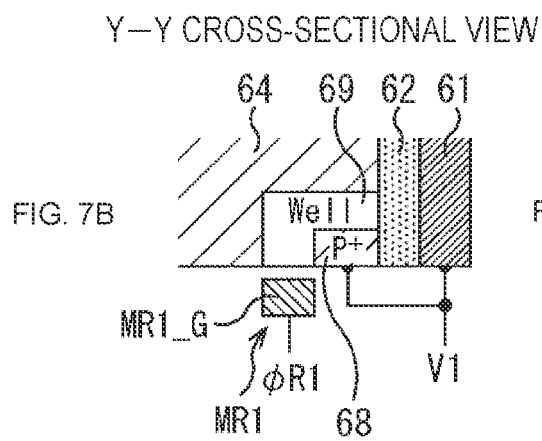
FIG. 7B Y–Y CROSS-SECTIONAL VIEW
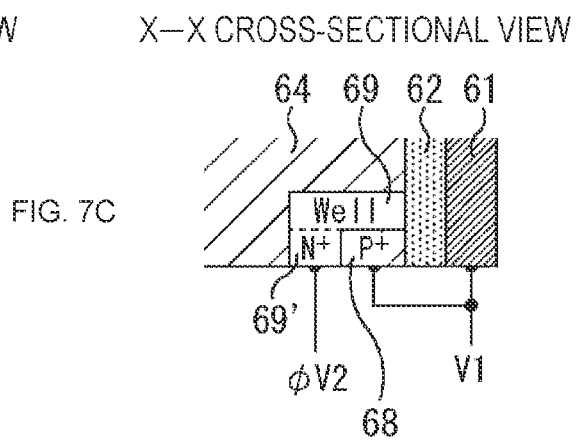
FIG. 7C X–X CROSS-SECTIONAL VIEW
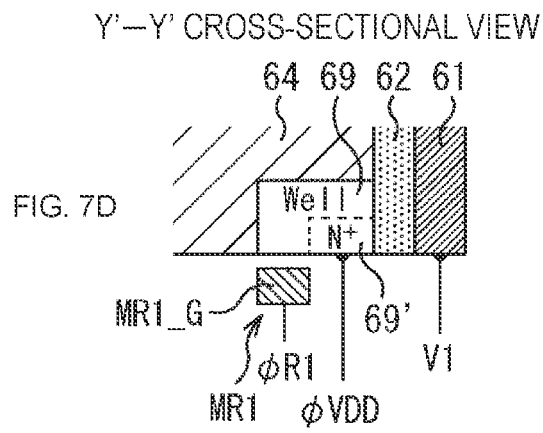
FIG. 7D Y'–Y' CROSS-SECTIONAL VIEW
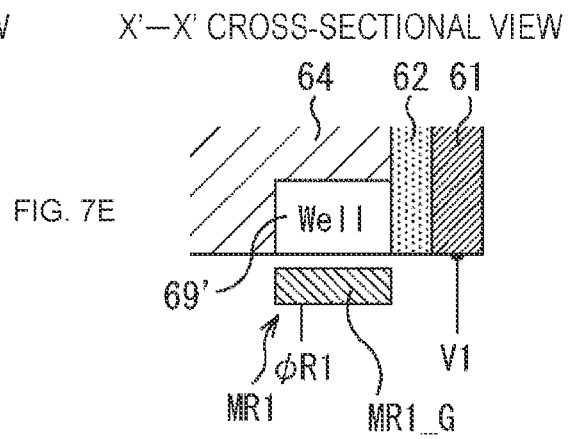
FIG. 7E X'–X' CROSS-SECTIONAL VIEW

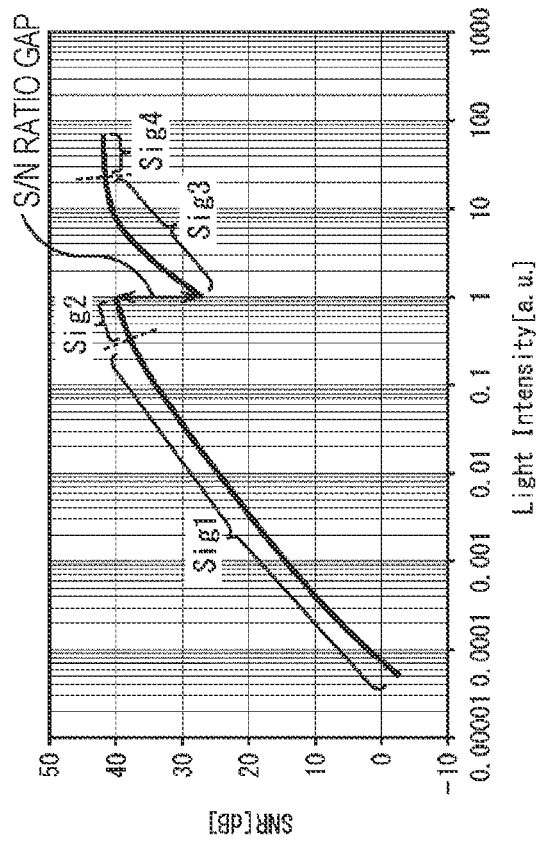
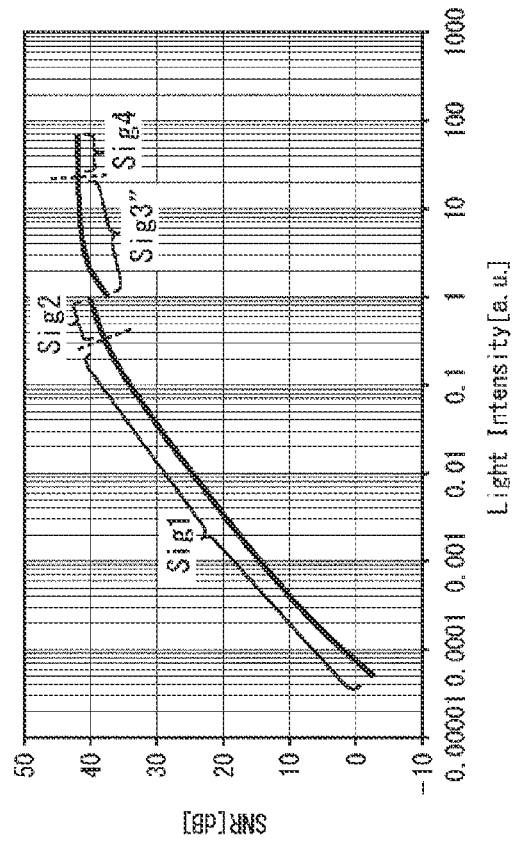
FIG. 10A
FIG. 10B

SOLID-STATE IMAGING DEVICE, METHOD OF DRIVING THE SAME, AND ELECTRONIC APPARATUS

CROSS REFERENCE TO RELATED APPLICATIONS

This application is a U.S. National Phase of International Patent Application No. PCT/JP2019/032121 filed on Aug. 16, 2019, which claims priority benefit of Japanese Patent Application No. JP 2018-163987 filed in the Japan Patent Office on Aug. 31, 2018. Each of the above-referenced applications is hereby incorporated herein by reference in its entirety.

TECHNICAL FIELD

The present technology relates to solid-state imaging devices, methods of driving the same, and electronic apparatuses. In particular, the present technology relates to a solid-state imaging device that detects both electrons and holes to perform high dynamic range imaging, obtaining a high-quality image, a method of driving the same, and an electronic apparatus.

BACKGROUND ART

There is a technique of detecting both electrons and holes to achieve high dynamic range imaging (see, e.g., Patent Document 1 and Non-Patent Document 1). In this technique, electrons obtained by photoelectric conversion are stored in a normal buried photodiode, and holes are stored in the pixel ground of the photodiode. Electrons and holes are generated with substantially the same quantum efficiency by incident light, but electrons output a dark subject with high sensitivity, and holes output a bright subject with low sensitivity such that the photodiode is saturated with electrons. Thus, the combination of signals caused by electrons and holes makes it possible to achieve high dynamic range imaging that can respond to a subject with a wide range of brightness.

CITATION LIST

Patent Document

Patent Document 1: U.S. Unexamined Patent Application Publication No. 2017/0186806

Non-Patent Document

Non-Patent Document 1: F. Lalenne, "A 750 K Photocharge Linear Full Well in a 3.2 µm HDR Pixel with Complementary Carrier Collection," Journal of MDPI, Sensors, 18, 305, 2018.

SUMMARY OF THE INVENTION

Problems to be Solved by the Invention

In the technique disclosed in the above-described document, the signal caused by electrons stored in the photodiode is read out, and then the signal caused by holes stored in the hole storage capacitor is read. In reading out the signal caused by electrons, holes generated by photoelectric conversion are stored in the hole storage capacitor. This causes the potential of the P-type pixel substrate that constitutes the hole storage capacitor not to be 0 V but a positive potential.

In addition, the technique disclosed in the above-described document controls the P-type pixel substrate to be electrically floating in reading out the signal caused by electrons. In this state, there can be a case where a positive voltage pulse is applied to a gate electrode of a transfer transistor to read out the signal caused by electrons. In this case, the potential of the P-type pixel substrate can change further in the positive direction due to the parasitic capacitance coupling between the transfer gate electrode and the P-type pixel substrate. The P-type pixel substrate's positive potential, rather than the 0 V potential, in transferring electrons causes a satisfactory electric field to fail to be applied to the transfer transistor channel, adversely affecting the transfer of electrons from the photodiode to the floating diffusion. In one example, there are concerns that the potential barrier that hinders the transfer of electrons from the photodiode to the floating diffusion can occur in the transfer transistor channel, and the electrons that failed to be transferred to the floating diffusion remain in the photodiode. Furthermore, there is a concern that the residual electrons in the photodiode can cause deterioration in image quality, such as the occurrence of afterimages or a decrease in the S/N ratio, in an image that is output from the image sensor.

The present technology is made in view of this situation and directs for a solid-state imaging device that detects both electrons and holes and performs high dynamic range imaging to satisfactorily read out the charge generated by photoelectric conversion.

Solutions to Problems

According to a first aspect of the present technology, a solid-state imaging device includes a pixel having a photodiode that performs photoelectric conversion on incident light, and a driving control unit configured to control driving of the pixel, in which the pixel stores a first charge generated by the photoelectric conversion in the photodiode and stores a second charge generated by the photoelectric conversion in a first capacitor provided in a pixel separation portion, and the driving control unit causes a pixel signal due to the second charge stored in the first capacitor to be output and then a pixel signal due to the first charge stored in the photodiode to be output.

According to a second aspect of the present technology, a method of driving a solid-state imaging device including a pixel having a photodiode that performs photoelectric conversion on incident light, and a driving control unit configured to control driving of the pixel includes: storing, by the pixel, a first charge generated by the photoelectric conversion in the photodiode and storing a second charge generated by the photoelectric conversion in a first capacitor provided in a pixel separation portion; and causing, by the driving control unit, a pixel signal due to the second charge stored in the first capacitor to be output and then a pixel signal due to the first charge stored in the photodiode to be output.

According to a third aspect of the present technology, an electronic apparatus including a solid-state imaging device includes a pixel having a photodiode that performs photoelectric conversion on incident light, and a driving control unit configured to control driving of the pixel, in which the pixel stores a first charge generated by the photoelectric conversion in the photodiode and stores a second charge generated by the photoelectric conversion in a first capacitor provided in a pixel separation portion, and the driving control unit causes a pixel signal due to the second charge stored in the first capacitor to be output and then a pixel signal due to the first charge stored in the photodiode to be output.

In the first to third aspects of the present technology, a first charge generated by the photoelectric conversion is stored in the photodiode and a second charge generated by the photoelectric conversion is stored in a first capacitor provided in a pixel separation portion. a pixel signal due to the second charge stored in the first capacitor is output and then a pixel signal due to the first charge stored in the photodiode is output.

The solid-state imaging device and the electronic apparatus may be independent apparatuses or modules incorporated into other apparatuses.

Effects of the Invention

According to the first to third aspects of the present technology, it is possible to achieve a satisfactory readout of the charge generated by photoelectric conversion.

Note that the advantageous effects described here are not necessarily limiting and any advantageous effect described in the present disclosure may be obtained.

BRIEF DESCRIPTION OF DRAWINGS

FIGS. 7A, 7B, 7C, 7D, and 7E are plan views and a cross-sectional view of the first reset transistor.

FIGS. 10A and 10B are diagrams illustrated to describe a dark current improvement effect produced by a dark current correction processing unit.

MODE FOR CARRYING OUT THE INVENTION

Figure 1:
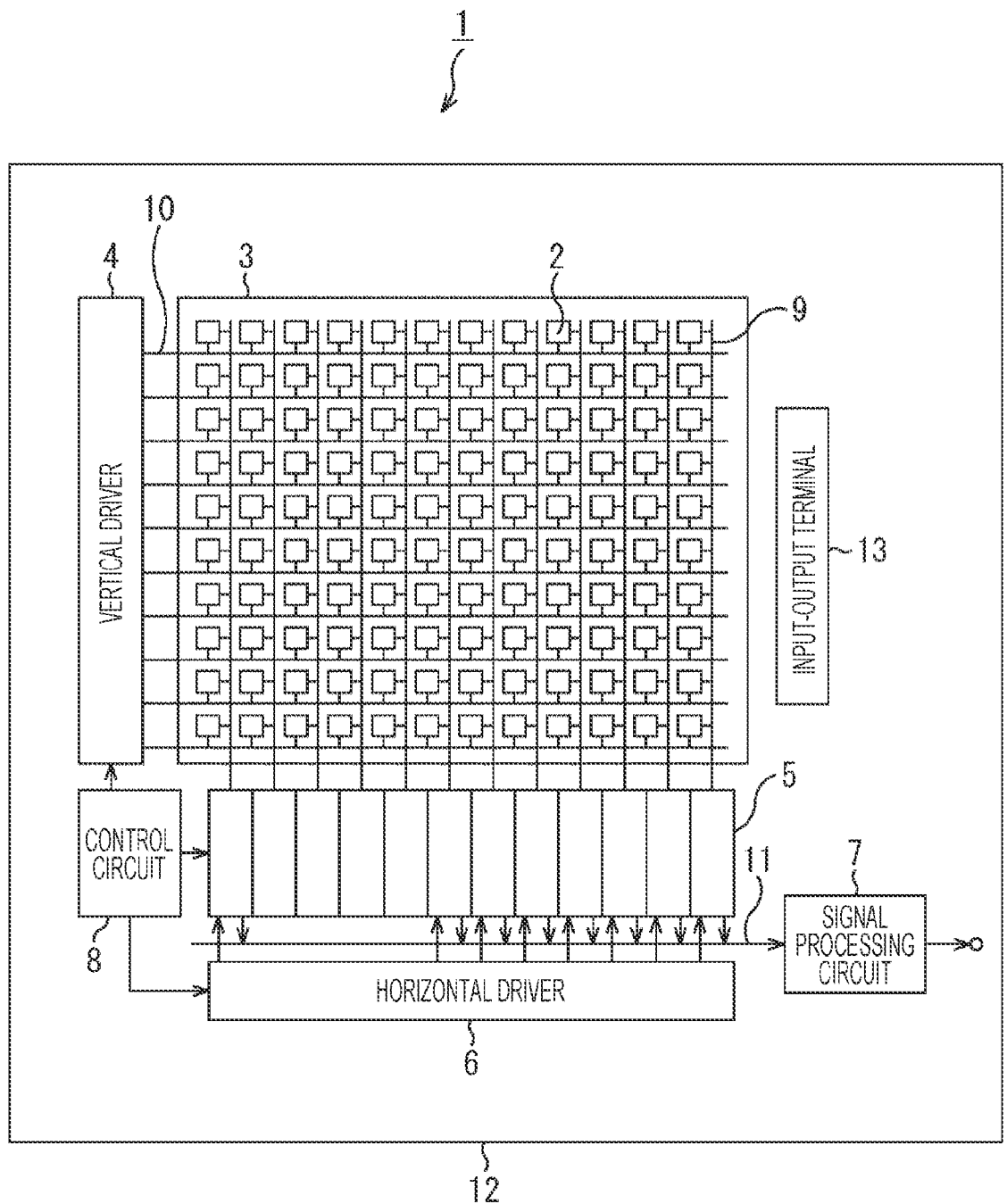
FIG. 1 is a diagram illustrating a schematic configuration of a solid-state imaging device to which the present technology is applied.

Embodiments for implementing the present technology (hereinafter, referred to as embodiments) will be described below. Note that the description is given in the following order.

1. Schematic configuration example of solid-state imaging device
2. Pixel circuit and its cross-sectional structure
3. Pixel driving
4. Numerical example
5. Detailed structure of first reset transistor MR1
6. Dark current correction processing
7. Structure in which polarities of electrons and holes are reversed
8. Other structural examples of pixel boundary portion
9. Summary
10. Examples of application to electronic apparatus
11. Examples of practical use for mobile objects <1. Schematic Configuration Example of Solid-State Imaging Device>

FIG. 1 illustrates a schematic configuration of a solid-state imaging device to which the present technology is applied.

In FIG. 1, a solid-state imaging device 1 includes a pixel array section 3 and peripheral circuits of the pixel array section 3. The pixel array section 3 has a pixel 2 arranged in a two-dimensional array on a semiconductor substrate 12 formed with a semiconductor material, for example, silicon (Si). The peripheral circuit includes a vertical driver 4, a column signal processing circuit 5, a horizontal driver 6, a signal processing circuit 7, a control circuit 8, and the like.

The pixel 2 includes a photoelectric transducer such as a photodiode and a plurality of pixel transistors. Examples of the plurality of pixel transistors include a transfer transistor, a selection transistor, a reset transistor, an amplification transistor, and the like. The pixel transistor is formed with a MOS transistor. The pixel 2 will be described in detail later with reference to FIGS. 2 and 3.

The control circuit 8 receives an input clock and data used to instruct an operation mode or the like and outputs data such as internal information of the solid-state imaging device 1. In other words, the control circuit 8 generates a clock signal or a control signal used as a reference for the operation of the vertical driver 4, the column signal processing circuit 5, the horizontal driver 6, or the like on the basis of the vertical synchronization signal, the horizontal synchronization signal, and the master clock. Then, the control circuit 8 outputs the generated clock signal or control signal to the vertical driver 4, the column signal processing circuit 5, the horizontal driver 6, or the like.

The vertical driver 4 is configured as, for example, a shift register. The vertical driver 4 selects a predetermined pixel driving wiring 10, supplies a pulse for driving the pixel 2 to the selected pixel driving wiring 10, and drives the pixel 2 in row units. In other words, the vertical driver 4 selectively scans the respective pixels 2 of the pixel array section 3 in row units sequentially in the vertical direction. The vertical driver 4 causes a pixel signal based on the signal charge generated in a photoelectric conversion unit of each pixel 2 depending on the amount of received light to be supplied to the column signal processing circuit 5 through a vertical signal line 9.

The column signal processing circuit 5 is placed for each vertical column of the pixel 2 and performs signal processing such as noise removal for each pixel array of the signal that is output from the pixel 2 for one horizontal row. For example, the column signal processing circuit 5 performs signal processing such as correlated double sampling (CDS) and A/D conversion for removing fixed pattern noise specific to pixels.

The horizontal driver 6 is configured as, for example, a shift register. The horizontal driver 6 sequentially outputs horizontal scanning pulses to select sequentially the column signal processing circuits 5. The horizontal driver 6 causes pixel signals that are output from the column signal processing circuits 5 to output to a horizontal signal line 11.

The signal processing circuit 7 performs predetermined signal processing on the signals sequentially supplied from the respective column signal processing circuits 5 through the horizontal signal line 11 and outputs the result. The signal processing circuit 7 only performs, for example, buffering in some cases. The signal processing circuit 7 also performs dark current correction, column variation correction, various types of digital signal processing, or the like in some cases. The input-output terminal 13 communicates signals with the outside.

The solid-state imaging device 1 configured as described above is a CMOS image sensor, called a column AD mode, in which the column signal processing circuit 5 that performs CDS processing and A/D conversion processing is placed for each pixel array.

The solid-state imaging device 1 is a solid-state imaging device that detects both electrons and holes to achieve high dynamic range imaging. The solid-state imaging device 1 that achieves high dynamic range imaging is now described in detail.

<2. Pixel Circuit and its Cross-Sectional Structure>

The circuit of the pixel 2 that detects both electrons and holes and its cross-sectional structure are described with reference to FIGS. 2 and 3.

Figure 2:
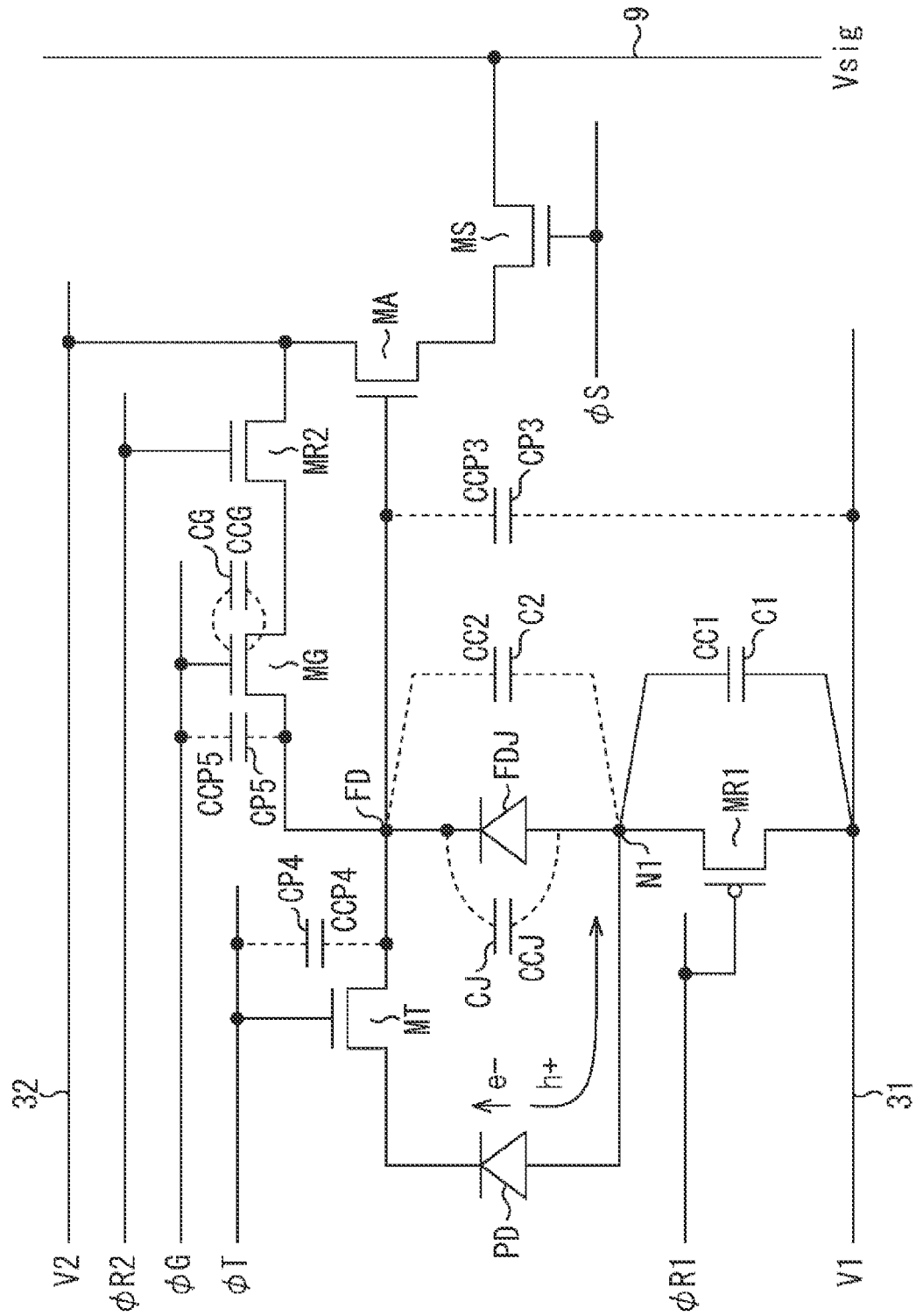
FIG. 2 is a diagram illustrating a circuit equivalent to a pixel.
Figure 3:
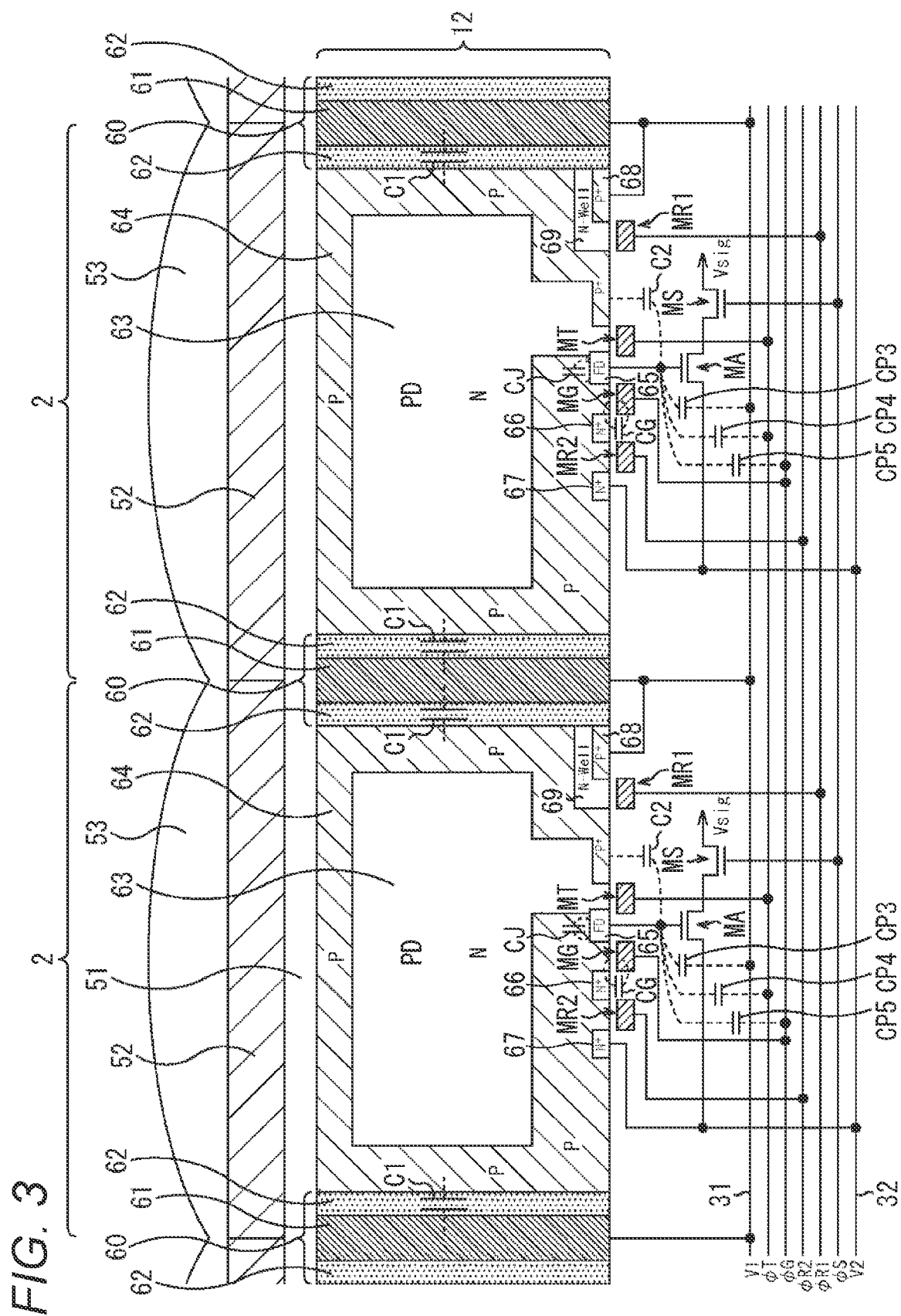
FIG. 3 is a diagram illustrating a cross-sectional structure of a pixel.

FIG. 2 illustrates a circuit equivalent to the pixel 2, and FIG. 3 illustrates a cross-sectional structure of the pixel 2.

As illustrated in FIG. 2, as wiring for applying a voltage to the pixel 2, a first voltage supply line 31 used to apply a first voltage V1 and a second voltage supply wiring 32 used to apply a second voltage V2 are connected to the pixel 2.

In this description, the first voltage V1 is, for example, the ground voltage (i.e., GND voltage of, e.g., 0 V), and the second voltage V2 is, for example, the power supply voltage (i.e., VDD voltage). Moreover, the first voltage V1 is not limited to 0 V but can be a negative voltage, or a positive voltage lower than the second voltage V2. (Sometimes, the first voltage V1 other than the GND voltage is herein referred to as VPGB for convenience)

The solid-state imaging device 1 includes a variable power supply mechanism that changes the magnitude of the voltage applied to the pixel 2 over time as a mechanism for applying the second voltage V2 to the pixel 2 (i.e., a mechanism for supplying power to the pixel 2). This variable power supply mechanism is capable of applying a plurality of types of voltages, such as (1) a high voltage $VDD_H$ and (2) a low voltage $VDD_L$, to the pixel 2. The high voltage $VDD_H$ is the voltage used to reset the state of a photodiode PD and a floating diffusion FD provided in the pixel 2 or the voltage used to activate a transistor provided in the pixel 2. The low voltage $VDD_L$ is the voltage used to stop the operation of a transistor provided in the pixel 2. Moreover, the magnitude of the low voltage $VDD_L$ can be the same as or different from that of the first voltage V1.

As illustrated in FIG. 2, the pixel 2 includes a photodiode PD, a first reset transistor MR1, a transfer transistor MT, a conversion gain switching transistor MG, a second reset transistor MR2, an amplification transistor MA, a selection transistor MS, a floating diffusion FD, a first capacitor C1, and a second capacitor C2.

The transfer transistor MT, the conversion gain switching transistor MG, the second reset transistor MR2, the amplification transistor MA, the selection transistor MS, and the first reset transistor MR1 are configured as a MOS transistor. More specifically, the transfer transistor MT, the conversion gain switching transistor MG, the second reset transistor MR2, the amplification transistor MA, and the selection transistor MS are configured as an N-type MOS transistor (NMOS transistor). The first reset transistor MR1 is configured as a P-type MOS transistor (PMOS transistor).

The anode of the photodiode PD is a node N1, which is formed with a P-type semiconductor. The node N1 in the P-type semiconductor region is connected to the first voltage supply line 31 via the first reset transistor MR1 that is a P-type MOS transistor. The cathode of the photodiode PD is connected to the floating diffusion FD acting as a charge-to-voltage converter via the transfer transistor MT.

The first reset transistor MR1 connects the node N1 that is the anode of the photodiode PD to the first voltage supply line 31, or disconnects the node N1 from the first voltage supply line 31 to put the node N1 in a floating state. The conduction of the first reset transistor MR1 by a first reset signal φR1 causes the node N1 to be connected to the first voltage supply line 31 and the node N1 to be reset to the first voltage V1. If the first reset transistor MR1 is brought into a non-conductive state by the first reset signal φR1, the node N1 is in a floating state.

When the transfer transistor MT is made conductive by a transfer signal φT, the transfer transistor MT reads out the charge (electrons) generated by the photodiode PD and transfers it to the floating diffusion FD.

The floating diffusion FD (i.e., the floating diffusion capacitance FD) is a charge-to-voltage converter and acts as a charge storage unit that temporarily retains the charge until the signal converted into voltage is output to the outside of the pixel via the vertical signal line 9. The floating diffusion FD also acts as a drain region of the transfer transistor MT (N-type semiconductor diffusion layer region). Moreover, the transfer transistor MT and the floating diffusion FD are disposed in the P-type semiconductor region (node N1) that is the anode of the photodiode PD. Thus, a PN junction, FDJ, is disposed between the floating diffusion FD and the P-type semiconductor region (node N1) that acts as the anode of the photodiode PD. The junction capacitance provided in the PN junction FDJ is referred to as CJ. The floating diffusion FD is connected to the photodiode PD via the transfer transistor MT and is also connected to the second voltage supply wiring 32 via the conversion gain switching transistor MG and the second reset transistor MR2. Furthermore, the floating diffusion FD is also connected to the gate of the amplification transistor MA.

The conversion gain switching transistor MG and the second reset transistor MR2 are connected in series and are disposed between the floating diffusion FD and the second voltage supply wiring 32. The conversion gain switching transistor MG switches the conversion gain of the floating diffusion FD in response to a switching signal φG. Specifically, when the switching signal φG makes the conversion gain switching transistor MG conductive (ON state), the gate capacitance CG of the conversion gain switching transistor MG is electrically connected to the floating diffusion FD, causing the capacitance of the floating diffusion FD to increase. This causes the voltage signal generated by converting a certain amount of charge in the floating diffusion FD into a voltage to be a state that is smaller than that in the case where the conversion gain switching transistor MG is non-conductive. This state is called a low conversion gain state. On the other hand, when the switching signal φG makes the conversion gain switching transistor MG non-conductive (OFF state), the gate capacitance CG of the conversion gain switching transistor MG is electrically disconnected from the floating diffusion FD. As a result, the capacitance of the floating diffusion FD is smaller than that in the case where the conversion gain switching transistor MG is conductive. This causes the voltage signal generated by converting a certain amount of charge in the floating diffusion FD into a voltage to be larger than that in the case where the conversion gain switching transistor MG is conductive. This state is called a high conversion gain state.

When the second reset transistor MR2 is brought into a conductive state by the second reset signal φR2, the second reset transistor MR2 discharges the charge held in the floating diffusion FD to the second voltage supply wiring 32 to reset the potential of the floating diffusion FD to the second voltage V2. When the second reset transistor MR2 performs the reset operation, the conversion gain switching transistor MG is also brought into the conductive state at the same time.

The amplification transistor MA outputs a pixel signal Vsig corresponding to the potential of the floating diffusion FD to the vertical signal line 9. The amplification transistor MA constitutes a load MOS (not shown), which is connected to the vertical signal line 9 and functions as a constant current source, and a source follower circuit. Then, the amplification transistor MA outputs the pixel signal Vsig indicating the level corresponding to the charge held in the floating diffusion FD from the amplification transistor MA to the column signal processing circuit 5 (FIG. 1) via the selection transistor MS and the vertical signal line 9. The load MOS is provided in, for example, the column signal processing circuit 5.

The selection transistor MS is brought into a conductive state when the pixel 2 is selected by the selection signal φS, and the pixel signal Vsig of the pixel 2 is output to the column signal processing circuit 5 via the vertical signal line 9. The transfer signal φT, the switching signal φG, the second reset signal φR2, the first reset signal φR1, and the selection signal φS are controlled by the vertical driver 4 that is a driving control unit that controls the driving of the pixel 2 and are supplied via the pixel driving wiring 10 (FIG. 1).

In FIG. 2, the first capacitor C1 is capacitance connected between the node N1 acting as the anode of the photodiode PD and the first voltage supply line 31 in terms of the equivalent circuit. The specific configuration of the first capacitor C1 will be described later, but it can be parasitic capacitance parasitic on the constituent component of the pixel 2 or a capacitance added intentionally. The first capacitor C1 is, in one example, the capacitance having a P-type semiconductor region acting as the anode of the photodiode PD, an electrode placed inside a trench arranged around each pixel, and an insulating film placed between the P-type semiconductor region and the electrode inside the trench. Moreover, the magnitude of the capacitance of the first capacitor C1 is sometimes referred to hereinafter as CC1.

In FIG. 2, multiple types of capacitance are connected to the floating diffusion FD.

The junction capacitance CJ is capacitance connected between the floating diffusion FD and the node N1 in terms of the equivalent circuit. The junction capacitance CJ is junction capacitance provided between the floating diffusion FD that is an N-type semiconductor diffusion layer region and the node N1 that is a P-type semiconductor region. Moreover, the magnitude of the junction capacitance CJ is sometimes referred to hereinafter as CCJ.

The second capacitor C2 is also capacitance connected between the floating diffusion FD and the node N1 in terms of the equivalent circuit. The specific configuration of the second capacitor C2 will be described later, but it can be parasitic capacitance parasitic on the constituent elements of the pixel 2 or capacitance added intentionally. The second capacitor C2 causes, in one example, parasitic capacitance between the wiring connected to the floating diffusion FD and the node N1 that is a P-type semiconductor region. Moreover, the magnitude of the capacitance of the second capacitor C2 is sometimes referred to hereinafter as CC2.

The combined capacitance of the junction capacitance CJ and the second capacitor C2, which is the capacitance connected between the floating diffusion FD and the node N1, is sometimes referred to as "FD capacitance relevant to node N1", i.e., CFDtoN1. In addition, the magnitude of the FD capacitance CFDtoN1 relevant to node N1 is sometimes referred to as CCFDtoN1.

A third capacitor CP3 to a fifth capacitor CP5 are capacitance connected between the floating diffusion FD and a region where the voltage is the first voltage V1, in terms of the equivalent circuit. The specific configuration of the third capacitor CP3 to the fifth capacitor CP5 will be described later. As an example, the third capacitor CP3 causes parasitic capacitance between the floating diffusion FD and the first voltage supply line 31 or between the wiring connected to the floating diffusion FD (i.e., FD wiring) and the first voltage supply line 31. The fourth capacitor CP4 causes parasitic capacitance between the floating diffusion FD and the wiring that transmits the transfer signal φT or between the wiring connected to the floating diffusion FD and the wiring that transmits the transfer signal φT. The fifth capacitor CP5 causes parasitic capacitance between the floating diffusion FD and the wiring that transmits the switching signal φG or between the wiring connected to the floating diffusion FD and the wiring that transmits the switching signal φG. Moreover, the magnitudes of the pieces of capacitance of the third capacitor CP3 to the fifth capacitor CP5 are sometimes referred to hereinafter as CCP3 to CCP5, respectively. The parasitic capacitance caused between the floating diffusion FD and the region where the voltage is the first voltage V1 can exist other than the third capacitor CP3 to the fifth capacitor CP5 but herein omitted.

The combined capacitance of the third capacitor CP3 to the fifth capacitor CP5 and the parasitic capacitance other than these capacitors, which is the capacitance connected between the floating diffusion FD and the region where the voltage is the first voltage V1, is sometimes referred to as FD capacitance CFDtoV1 to the first voltage V1. In addition, the magnitude of the FD capacitance CFDtoV1 relevant to the first voltage V1 is sometimes referred to as CCFDtoV1.

Moreover, the total capacitance of the floating diffusion FD, that is, the combined capacitance of the FD capacitance CFDtoN1 between the floating diffusion FD and the node N1 and the FD capacitance CFDtoV1 between the floating diffusion FD and the region having the first voltage V1 is sometimes referred to as CFD. The magnitude of the total capacitance CFD of the floating diffusion FD is sometimes referred to as CCFD.

The gate capacitance CG of the conversion gain switching transistor MG is electrically connected to or disconnected from the floating diffusion FD by the switching signal φG as described above. Moreover, the magnitude of the gate capacitance CG of the conversion gain switching transistor MG is sometimes referred to hereinafter as CCG.

The cross-sectional structure of the pixel 2 is now described with reference to FIG. 3.

In the pixel array section 3, the pixels 2 are disposed side by side in a two-dimensional array, as illustrated in FIG. 3. Light is incident on the semiconductor substrate 12 provided in the pixel 2 from the upper side (north side) of FIG. 3. In this description, the semiconductor substrate 12 has two surfaces. The surface on the side where light is incident (a surface on the upper side (north side) in FIG. 3) is referred herein to as a back surface of the semiconductor substrate 12 for convenience. The other surface of the semiconductor substrate 12 (a surface facing the incident surface of light, the lower surface (south side) of FIG. 3) is herein referred to as a front surface of the semiconductor substrate 12 for convenience. An interlayer film 51, a color filter 52, and a microlens 53 are disposed in this order on the back surface side of the semiconductor substrate 12 on the upper side of FIG. 3. Examples of the material to be used for the interlayer film 51 include silicon oxide (SiO2) or the like. In addition to the interlayer film 51, an antireflection film, a fixed charge film, or other similar films including silicon nitride (SiN), hafnium oxide (HfO2), or the like can be disposed on the back surface side of the semiconductor substrate 12, for example.

The color filter 52 has, for example, an R (red), G (green), or B (blue) Bayer array. The color filter 52 is formed by, for example, spin coating the photosensitive resin containing a coloring matter such as a pigment or a dye. The microlens 53 is formed using, as a material, a resin-based substance such as a styrene-based resin, an acrylic-based resin, a styrene-acrylic copolymer-based resin, or a siloxane-based resin, for example.

In the semiconductor substrate 12 of the pixel array section 3, a trench isolation 60 that penetrates the semiconductor substrate 12 is provided at a boundary portion of the pixels 2 arranged adjacent to each other. The trench isolation 60 has a trench electrode 61 placed at the center thereof and an insulating film 62 placed on both sides of the trench electrode 61. The trench electrode 61 is formed using, as a material, a metal substance such as tungsten (W), aluminum (Al), and copper (Cu) or a substance such as polysilicon. The trench electrode 61 is electrically connected to the first voltage supply line 31. The insulating film 62 placed on both sides of the trench electrode 61 is formed using, as a material, an oxide such as silicon oxide (SiO2) or other insulating substances. The trench isolation 60 provided with the trench electrode 61 and the insulating film 62 functions as a pixel separation portion that electrically separates the adjacent pixels 2.

The pixels 2 provided in the pixel array section 3 each include a photodiode PD. The photodiode PD includes an N-type semiconductor region 63 acting as a cathode and a P-type semiconductor region 64 acting as an anode.

The photodiode PD provided in the pixel 2 includes the trench isolation 60, which penetrates the semiconductor substrate 12, around the photodiode PD. Thus, the photodiode PD provided in the pixel 2 is electrically separated from another photodiode PD provided in the adjacent pixels 2 for each pixel. The first reset transistor MR1 electrically connects or separates the P-type semiconductor region 64 acting as the anode of the photodiode PD to or from the first voltage supply line 31. The P-type semiconductor region 64 acting as the anode of the photodiode PD is in a floating state when it is separated from the first voltage supply line 31 by the first reset transistor MR1. The N-type semiconductor region 63 acting as the cathode of the photodiode PD is electrically connected to and separated from the floating diffusion FD by the transfer transistor MT.

Furthermore, the photodiode PD provided in the pixel 2 is a buried photodiode with the P-type semiconductor region 64 acting as the anode and the N-type semiconductor region 63 acting as the cathode. The P-type semiconductor region 64 is placed on the side surface, the upper surface, and the lower surface of the photodiode PD. The N-type semiconductor region 63 is placed inside the photodiode PD. More specifically, on the side surface of the photodiode PD, the P-type semiconductor region 64 is placed along the inside of the trench isolation 60 (inward direction of the pixel) placed at the boundary portion of each pixel 2. Furthermore, the P-type semiconductor region 64 is also placed along the back surface (upper side of FIG. 3) of the semiconductor substrate 12 provided in each pixel 2. Moreover, the P-type semiconductor region 64 is also placed in a region in the front surface of the semiconductor substrate 12 (lower side of FIG. 3) other than transistors provided in the pixel 2.

Further, in FIG. 3, the sign "+" in N+ or P+ represents a region in which N-type or P-type is highly doped.

On the front surface side of the semiconductor substrate 12 that is the lower side in FIG. 3, the transfer transistor MT, the conversion gain switching transistor MG, the second reset transistor MR2, the amplification transistor MA, the selection transistor MS, the first reset transistor MR1, the floating diffusion FD, or the like are disposed. Moreover, the amplification transistor MA and the selection transistor MS are difficult to be represented on the same cross section, so they are represented as a symbol indicating a circuit. Among these devices, devices except the first reset transistor MR1 that is a PMOS transistor disposed in the P-type semiconductor region 64, such as the transfer transistor MT, the conversion gain switching transistor MG, the second reset transistor MR2, the amplification transistor MA, the selection transistor MS, the amplification transistor MA, the selection transistor MS, and the floating diffusion FD.

The transfer transistor MT transfers the charge (electrons) stored in the N-type semiconductor region 63 to an N-type semiconductor region 65 functioning as the floating diffusion FD when the transfer signal φT makes the transfer transistor MT conductive. The N-type semiconductor region 65 functioning as the floating diffusion FD is connected to the gate of the amplification transistor MA.

An N-type semiconductor region 66 functions as the drain region of the conversion gain switching transistor MG and the source region of the second reset transistor MR2. An N-type semiconductor region 67 functions as the drain region of the second reset transistor MR2 and is connected to the second voltage supply wiring 32 and the drain region of the amplification transistor MA.

The first reset transistor MR1 is disposed on the front surface side of the semiconductor substrate 12 and is disposed in a predetermined region near the trench isolation 60 at the boundary of the pixel. The first reset transistor MR1 is a P-type MOS transistor. An N-type well (N-well) 69 is formed in the region surrounded by the P-type semiconductor region 64. A gate electrode of the first reset transistor MR1 is disposed on the surface of the N-type well 69 with a gate insulator interposed between the gate electrodes. The gate electrode is connected to a wiring for transmitting the first reset signal φR1. A P-type semiconductor region 68 acting as the drain region of the first reset transistor MR1 is disposed in the region of the N-type well 69 in which the gate electrode is not disposed on the surface thereof. On the other hand, the P-type semiconductor region 64 surrounding the N-type well 69 also acts as the source region of the first reset transistor MR1. The P-type semiconductor region 68 acting as the drain region of the first reset transistor MR1 is connected to the first voltage supply line 31 together with the trench electrode 61.

An example of the configuration of the capacitor provided in the pixel 2 is now described with reference to FIG. 3.

The first capacitor C1 is constituted with the trench isolation 60 and the P-type semiconductor region 64 acting as the anode of the photodiode PD. Specifically, the first capacitor C1 is constituted with two electrodes and the insulating film 62 placed between these two electrodes, where one electrode is the trench electrode 61 connected to the first voltage supply line 31 and the other electrode is the P-type semiconductor region 64 acting as the anode of the photodiode PD.

The second capacitor C2 has capacitance between the floating diffusion FD and the P-type semiconductor region 64 acting as the anode of the photodiode PD or between the wiring connected to the floating diffusion FD (i.e., FD wiring) and the P-type semiconductor region 64. The second capacitor C2 can cause parasitic capacitance parasitic on the constituent components of the pixel 2 or capacitance added intentionally. For example, the second capacitor C2 can have parasitic capacitance caused between the wiring connected to the floating diffusion FD (i.e., FD wiring) and the P-type semiconductor region 64 acting as the anode of the photodiode PD. Alternatively, the second capacitor C2 can have capacitance intentionally added between the wiring connected to the floating diffusion FD (i.e., FD wiring) and the P-type semiconductor region 64 by making the width of a part of the wiring larger than the width of the other part. Alternatively, the second capacitor C2 can cause parasitic capacitance caused by the FD wiring, the P-type semiconductor region 64, and the interlayer film placed between the FD wiring and the P-type semiconductor region 64. In addition, the second capacitor C2 also can have capacitance added intentionally between the P-type semiconductor region 64 and another wiring, which is connected to the floating diffusion FD and is different from the FD wiring. Besides, the second capacitor C2 also can have capacitance added intentionally between the P-type semiconductor region 64 and the FD wiring by using an insulating material or a dielectric material different from the interlayer film.

The third capacitor CP3 causes a parasitic capacitance between the floating diffusion FD and the first voltage supply line 31 or between the wiring connected to the floating diffusion FD (i.e., FD wiring) and the first voltage supply line 31.

The fourth capacitor CP4 causes parasitic capacitance between the floating diffusion FD and the wiring that transmits the transfer signal φT or between the wiring connected to the floating diffusion FD and the wiring that transmits the transfer signal φT.

The fifth capacitor CP5 causes parasitic capacitance between the floating diffusion FD and the wiring that transmits the switching signal φG or between the wiring connected to the floating diffusion FD and the wiring that transmits the switching signal φG.

The junction capacitance CJ is the junction capacitance produced at the PN junction portion between the floating diffusion FD, which is the N-type semiconductor diffusion layer region, and the P-type semiconductor region 64 acting as the anode of the photodiode PD.

The gate capacitance CG is the gate capacitance of the conversion gain switching transistor MG.

A modification of the cross-sectional structure of the pixel 2 is now described with reference to FIG. 4.

Figure 4:
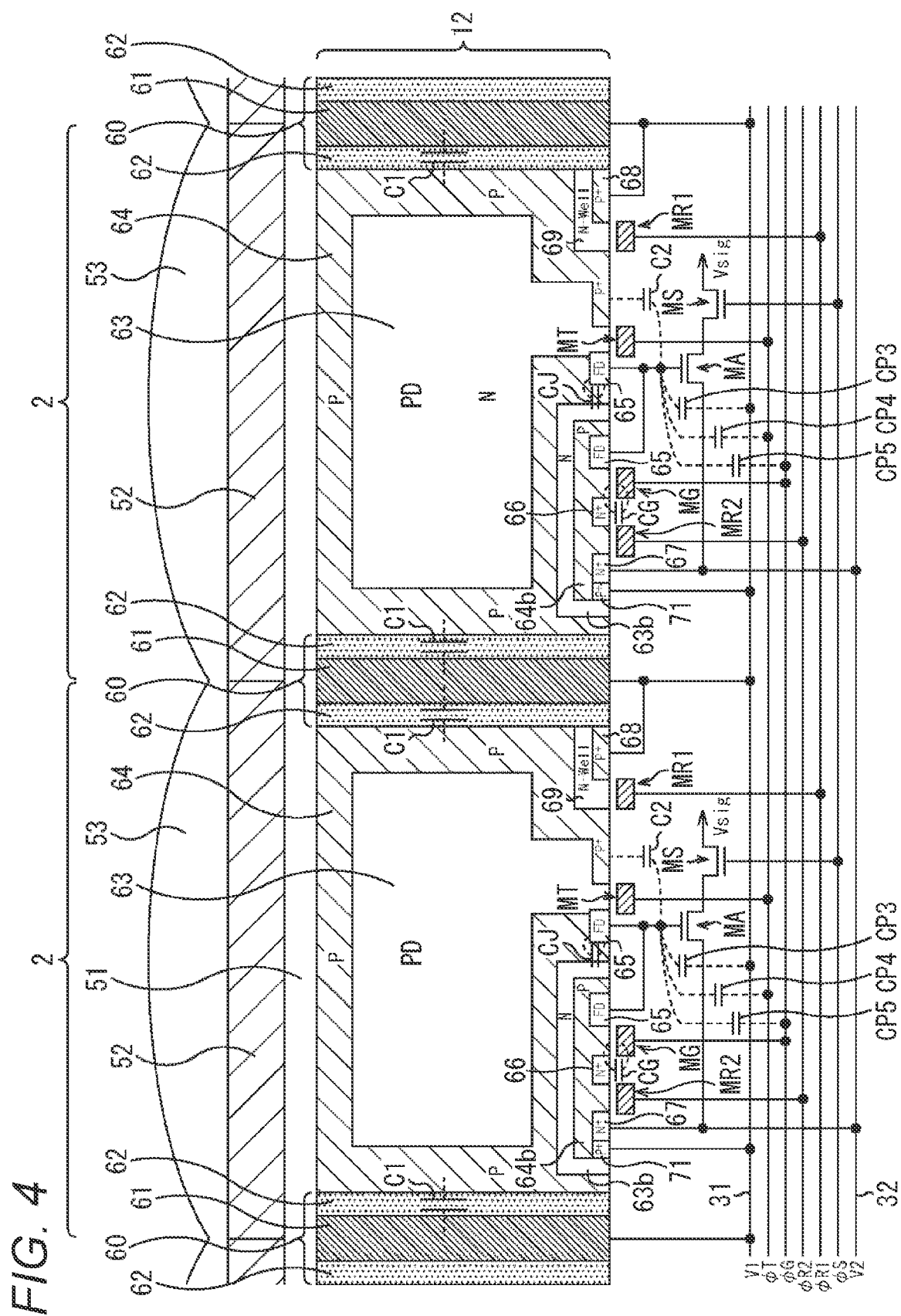
FIG. 4 is a diagram illustrating a modification of the cross-sectional structure of a pixel.

The pixel 2 illustrated in FIG. 4 is different from the pixel 2 illustrated in FIG. 3 in that the NMOS transistor is disposed in a second P-type semiconductor region 64b that is electrically separated from the P-type semiconductor region 64. The NMOS transistor is the transistors (i.e., the conversion gain switching transistor MG, the second reset transistor MR2, the amplification transistor MA, and the selection transistor MS) other than the transfer transistor MT among the pixel transistors provided in the pixel 2.

In FIG. 4, the pixel 2 includes the second P-type semiconductor region 64b different from the P-type semiconductor region 64 on the front surface side (lower side of FIG. 4) of the semiconductor substrate 12. Furthermore, a second N-type semiconductor region 63b is provided between the P-type semiconductor region 64 and the second P-type semiconductor region 64b. The second N-type semiconductor region 63b is placed to surround the second P-type semiconductor region 64b, achieving a well-in-well structure in which the P-type semiconductor region 64 and the second P-type semiconductor region 64b are electrically separated. Then, the second P-type semiconductor region 64b is connected to the first voltage supply line 31 via a P-type diffusion layer region 71 disposed in the second P-type semiconductor region 64b to supply the first voltage V1. Moreover, in FIG. 4, the drain region of the transfer transistor MT is disposed in the P-type semiconductor region 64, and the source region of the conversion gain switching transistor MG is disposed in the second P-type semiconductor region 64b. Thus, the drain region of the transfer transistor MT is electrically connected to the source region of the conversion gain switching transistor MG via the wiring.

In the pixel 2 illustrated in FIG. 3, the voltage in the P-type semiconductor region 64 in which the pixel transistors are disposed has a possibility of being affected depending on the amount of holes generated by photoelectric conversion. On the other hand, in the pixel 2 illustrated in FIG. 4, the voltage of the second P-type semiconductor region 64b in which the pixel transistors are disposed is constant regardless of the amount of holes generated by photoelectric conversion. Thus, the operation of the pixel transistor is expected to be more stable than that of the pixel 2 described with reference to FIG. 3.

<3. Pixel Driving>

The overview of the operation of the pixel 2 is described with reference to FIGS. 2 and 3.

The light incident on the photodiode PD provided in the pixel 2 is photoelectrically converted to generate electrons and holes. If this photoelectric conversion is performed in a state where the first reset transistor MR1 is non-conductive, the holes generated by the photoelectric conversion are stored in the first capacitor C1. This increases the potential of the P-type semiconductor region 64 (the node N1 in FIG. 2) that is one electrode of the first capacitor C1 and accordingly increases the potential of the floating diffusion FD. The increased potential of the floating diffusion FD is read out as a signal. Such signal readout brings the first reset transistor MR1 into a conductive state. This causes the holes stored in the first capacitor C1 to be discharged to the first voltage supply line 31 via the first reset transistor MR1 and causes the first capacitor C1 to be reset. In this case, the potential of the P-type semiconductor region 64 (node N1 in FIG. 2) is fixed at the first voltage V1. On the other hand, the electrons generated by the photoelectric conversion are stored in a potential well in the N-type semiconductor region 63 provided in the photodiode PD. If the stored holes described above are read out, the stored electrons described above are transferred to the floating diffusion FD via the transfer transistor MT, where the signal generated by the charge-to-voltage conversion is read. When the signal is read out, the electrons transferred to the floating diffusion FD and, if any, the electrons remaining in the potential well in the N-type semiconductor region 63 are discharged to the second voltage supply wiring 32 via the transfer transistor MT, the conversion gain switching transistor MG, and the second reset transistor MR2. The floating diffusion FD and the potential well in the N-type semiconductor region 63 are reset. The description above is the overview of the operation of the pixel 2.

The driving of the pixel 2 is now described with reference to the timing chart of FIG. 5.

At time t1, the second voltage V2 given to the pixel 2 is initially set from the low voltage $VDD_L$ to the high voltage $VDD_H$. The state of high voltage $VDD_H$ remains until time t4 is reached.

In the period from time t1 to time t4, the P-type semiconductor region 64 and the N-type semiconductor region 63 provided in the photodiode PD are reset, and the floating diffusion FD is reset. Specifically, in the period from time t2 to time t3, the first reset signal φR1 is set to a low level (Low), making the first reset transistor MR1 conductive and causes the potential of the P-type semiconductor region 64 of the photodiode PD to be reset to the first voltage V1. In addition, the transfer signal φT is set to a high level (High), making the transfer transistor MT conductive and also making the conversion gain switching transistor MG and the second reset transistor MR2 conductive. Thus, the N-type semiconductor region 63 of the photodiode PD and the floating diffusion FD are reset to the second voltage V2, which is the high voltage $VDD_H$.

Time t3 and subsequent time when the reset operation of the P-type semiconductor region 64 and the N-type semiconductor region 63 ends are the charge storage time (exposure time) in which the signal charge is stored depending on the incident light.

When the first reset signal φR1 is set to High at time t3, the first reset transistor MR1 is in the non-conductive state. Then, the holes generated by photoelectric conversion in the photodiode PD are stored in the first capacitor C1. As the holes are stored in the first capacitor C1, the potential of the P-type semiconductor region 64 (node N1 in FIG. 2), which is one electrode of the first capacitor C1, rises higher than the potential immediately after the reset operation.

Further, when the transfer signal φT is set to Low at time t3, the transfer transistor MT is in the non-conductive state. Then, the electrons generated by photoelectric conversion in the photodiode PD are stored in the potential well in the N-type semiconductor region 63. As the electrons are stored in the potential well in the N-type semiconductor region 63, the potential of the N-type semiconductor region 63 falls lower than the potential immediately after reset.

At time t4 subsequent to the reset operation, the second voltage V2 varies from the high voltage $VDD_H$ to the low voltage $VDD_L$.

At time t11 before starting the readout operation for reading the signal charge stored in the pixel 2, the second voltage V2 varies from the low voltage $VDD_L$ to the high voltage $VDD_H$ again.

The next period from time t12 to time t13 is a period for reading out a hole storage signal $Exp_{Low}4$ in a low conversion gain state.

In other words, at time t12, the selection signal φS rises to High, making the selection transistor MS conductive, and the second reset signal φR2 falls to Low, making the second reset transistor MR2 non-conductive. This separates the floating diffusion FD from the second voltage supply wiring 32. As a result, the potential of the P-type semiconductor region 64 (node N1 in FIG. 2) increased due to the storage of holes appears in the floating diffusion FD via the FD capacitance CFDtoN1 relevant to node N1 (combined capacitance of the junction capacitance CJ and the second capacitor C2).

In this stage, the switching signal φG is High until the next time t13 is reached, making the conversion gain switching transistor MG conductive. Thus, the hole storage signal $Exp_{Low}4$ in the low conversion gain state is output from the floating diffusion FD to the column signal processing circuit 5 via the amplification transistor MA, the selection transistor MS, and the vertical signal line 9.

The next period from time t13 to time t14 is a period for reading out a hole storage signal $Exp_{High}3$ in a high conversion gain state.

In other words, at time t13, the switching signal φG falls to Low, and the gate capacitance CG of the conversion gain switching transistor MG is separated from the floating diffusion FD. Thus, the floating diffusion FD is switched to the high conversion gain state. As the result, the hole storage signal $Exp_{High}3$ in the high conversion gain state is output from the floating diffusion FD to the column signal processing circuit 5 via the amplification transistor MA, the selection transistor MS, and the vertical signal line 9.

The next period from time t14 to time t15 is a period for reading out a hole reference signal $Ref_{High}3$ in the high conversion gain state.

In other words, at time t14, the first reset signal φR1 falls to Low, making the first reset transistor MR1 conductive. This allows the holes stored in the first capacitor C1 to be discharged to the first voltage supply line 31, and the potential of the P-type semiconductor region 64 (node N1 in FIG. 2) is reset to the first voltage V1. The potential of the node N1 after the reset appears in the floating diffusion FD via the FD capacitance CFDtoN1 relevant to node N1 (the combined capacitance of junction capacitance CJ and second capacitor C2).

In this stage, the switching signal φG is Low until the time t15 is reached, making the conversion gain switching transistor MG non-conductive. Thus, the hole reference signal $Ref_{High}3$ in the high conversion gain state is output from the floating diffusion FD to the column signal processing circuit 5 via the amplification transistor MA, the selection transistor MS, and the vertical signal line 9.

The next period from time t15 to time t16 is a period for reading out a hole reference signal $Ref_{Low}4$ in a low conversion gain state.

In other words, at time t15, the switching signal φG rises to High, making the conversion gain switching transistor MG conductive. This transition puts the gate capacitance CG of the conversion gain switching transistor MG to be added to the floating diffusion FD so that the floating diffusion FD is switched to the low conversion gain state. Thus, the reference signal $Ref_{Low}4$ of the hole in the low conversion gain state is output from the floating diffusion FD to the column signal processing circuit 5 via the amplification transistor MA, the selection transistor MS, and the vertical signal line 9.

The signals relating to holes are all output during the period from time t12 to time t16. Thus, the second reset signal φR2 is controlled to rise to High, making the second reset transistor MR2 conductive in the period from time t16 to time 17. This causes the floating diffusion FD to be temporarily reset.

The next period from time t17 to time t23 is a period for reading out the electrons stored in the photodiode PD.

The first period from time t17 to time t18 is a period for reading out a reference signal $\text{Ref}_{Low}2$ of the electrons in the low conversion gain state.

In other words, the switching signal φG continues to be High from time t15, and the conversion gain switching transistor MG is conductive. Thus, the reference signal $\text{Ref}_{Low}2$ of the electrons in the low conversion gain state is output from the floating diffusion FD to the column signal processing circuit 5 via the amplification transistor MA, the selection transistor MS, and the vertical signal line 9.

The subsequent period from time t18 to time t19 is a period for reading out a reference signal $\text{Ref}_{High}1$ of the electrons in the high conversion gain state.

In other words, at time t18, the switching signal φG falls to Low, and the gate capacitance CG of the conversion gain switching transistor MG is separated from the floating diffusion FD. Thus, the floating diffusion FD is switched to the high conversion gain state. As the result, the hole reference signal $\text{Ref}_{High}1$ of the electrons in the high conversion gain state is output from the floating diffusion FD to the column signal processing circuit 5 via the amplification transistor MA, the selection transistor MS, and the vertical signal line 9.

The next period from time t19 to time t20 is the transfer period for transferring the electrons stored in the photodiode PD to the floating diffusion FD in the high conversion gain state.

In the period from time t19 to time t20, the transfer signal φT rises to High, making the transfer transistor MT conductive. The switching signal φG continues to be Low from time t18, and the conversion gain switching transistor MG is non-conductive, so the floating diffusion FD is in the high conversion gain state. Thus, the electrons stored in the photodiode PD are transferred to the floating diffusion FD in the high conversion gain state.

The subsequent period from time t20 to time t21 is a period for reading out a storage signal $\text{Exp}_{High}1$ of the electrons in the high conversion gain state.

In the period from time t20 to time t21, the potential of the floating diffusion FD varies depending on the amount of charge of the electrons transferred from the photodiode PD. The electron storage signal $\text{Exp}_{High}1$ in the high conversion gain state is output from the floating diffusion FD to the column signal processing circuit 5 via the amplification transistor MA, the selection transistor MS, and the vertical signal line 9.

The next period from time t21 to time t22 is a period for switching the floating diffusion FD from the high conversion gain state to the low conversion gain state. In addition, this period also performs the transfer operation for additionally transferring the electrons remaining in the photodiode PD to the floating diffusion FD. This is to prevent the electrons, which failed to be transferred from the photodiode PD to the floating diffusion FD in the high conversion gain state, from remaining in the photodiode PD.

In other words, at time t21, the switching signal φG rises to High, making the conversion gain switching transistor MG conductive. This transition causes the floating diffusion FD to switch the state to the low conversion gain state by adding the gate capacitance CG of the conversion gain switching transistor MG while holding the electrons transferred from the photodiode PD at time t19. In parallel with this transition, the transfer signal φT rises to High, making the transfer transistor MT conductive. Thus, in the case where the electrons failed to be transferred from the photodiode PD to the floating diffusion FD in the high conversion gain state remain in the photodiode PD during the period from time t19 to time t20, the remaining electrons are transferred from the photodiode PD to the floating diffusion FD in the low conversion gain state.

The subsequent period from time t22 to time t23 is a period for reading out a storage signal $\text{Exp}_{Low}2$ of the electrons in the low conversion gain state.

In the period from time t22 to time t23, the potential of the floating diffusion FD varies depending on the amount of charge of the electrons transferred from the photodiode PD. The electron storage signal $\text{Exp}_{Low}2$ in the low conversion gain state is output from the floating diffusion FD to the column signal processing circuit 5 via the amplification transistor MA, the selection transistor MS, and the vertical signal line 9.

In the period from time t17 to time t23, the signals relating to electrons are all output.

At time t23, the selection signal φS falls to Low, making the selection transistor MS non-conductive, and the second reset signal φR2 rises High, making the second reset transistor MR2 conductive. In addition, the first reset signal φR1 rises to High, making the first reset transistor MR1 non-conductive.

At time t24 subsequent to time t23, the second voltage V2 supplied to the pixel 2 is changed from the high voltage $\text{VDD}_H$ to the low voltage $\text{VDD}_L$. The series of operations of resetting the pixel 2, storing the signal charge, and reading out the signal charge are completed.

Considering whether the output signal charge is a hole or an electron in the readout operation of the signal charge stored in the pixel 2, the period from time t12 to time t16 corresponds to the hole readout operation, and the period from time t17 to time t23 corresponds to the electron readout operation.

Considering whether the signal to be read is the reference signal Ref or the storage signal Exp, the period from time t12 to time t14 corresponds to the readout operation of the hole storage signal Exp, and the period from time t14 to time t16 corresponds to the readout operation of the hole reference signal Ref. The period from time t17 to time t19 corresponds to the readout operation of the electron reference signal Ref, and the period from time t20 to time t23 corresponds to the readout operation of the electron storage signal Exp.

Furthermore, considering whether the floating diffusion FD is in the high conversion gain state or the low conversion gain state, the period from time t12 to time t13 corresponds to the low conversion gain state, and the period from time t13 to time t15 corresponds to the high conversion gain state. The period from time t15 to time t18 corresponds to the low conversion gain state, the period from time t18 to time t21 corresponds to the high conversion gain state, and the period from time t21 to time t23 corresponds to the low conversion gain state.

Further, the hole storage time is the period from time t3 to time t14, and the electron storage time is the period from time t3 to time t20 (high conversion gain state) or from time t3 to time t22 (low conversion gain state).

The pixel 2 is driven as described above to perform the series of operations of the storage and readout of the signal charge.

It is assumed that the pixel signals of high conversion gain and low conversion gain caused by electrons are Sig1 and Sig2, respectively, and the pixel signals of high conversion gain and low conversion gain caused by holes are Sig3 and Sig4, respectively. The pixel signal Sig1 with high conversion gain caused by electrons is obtained by a difference between the reference signal $\text{Ref}_{High}1$ and the stored signal $\text{Exp}_{High}1$ ($\text{Sig1}=\text{Exp}_{High}1-\text{Ref}_{High}1$). The pixel signal Sig2 with low conversion gain caused by electrons is obtained by a difference between the reference signal $\text{Ref}_{Low}2$ and the stored signal $\text{Exp}_{Low}2$ ($\text{Sig2}=\text{Exp}_{Low}2-\text{Ref}_{Low}2$). The pixel signal Sig3 with high conversion gain caused by holes is obtained by a difference between the reference signal $\text{Ref}_{High}3$ and the stored signal $\text{Exp}_{High}3$ ($\text{Sig3}=\text{Exp}_{High}3-\text{Ref}_{High}3$). The pixel signal Sig4 with low conversion gain caused by holes is obtained by a difference between the reference signal $\text{Ref}_{Low}4$ and the stored signal $\text{Exp}_{Low}4$ ($\text{Sig4}=\text{Exp}_{Low}4-\text{Ref}_{Low}4$).

According to the above-mentioned driving, the solid-state imaging device 1 outputs the signal caused by holes and then outputs the signal caused by electrons. In this case, in the period for reading out the signal caused by electrons, specifically, the period time t17 to time t23, the first reset transistor MR1 is brought into conductive, causing the potential of the P-type semiconductor region 64 to be fixed to the first voltage V1. In the P-type semiconductor region 64, not only the N-type semiconductor region 63 of the photodiode PD but also the transfer transistor MT is disposed. Thus, according to the above-mentioned driving, in transferring electrons using the transfer transistor MT to read out the signal caused by electrons, it is possible to transfer electrons in the state where the potential of the P-type semiconductor region 64 in which the transfer transistor MT is disposed is fixed at the first voltage V1.

The description is now given of the driving disclosed in Non-Patent Document 1, that is, the driving in which a signal caused by electrons is output and then a signal caused by holes is output. In the case of such driving, it is necessary to read out the signal caused by electrons, while the holes generated by photoelectric conversion are not read out and are still stored in the first capacitor C1. In other words, it is necessary to transfer and to read out electrons from the photodiode PD to the floating diffusion FD using the transfer transistor MT. This is necessary to be performed in the state where the first reset transistor MR1 remains non-conductive and the holes generated by photoelectric conversion are stored in the first capacitor C1, similar to the hole storage period. Thus, it causes the potential of the P-type semiconductor region 64 (node N1 in FIG. 2) to be a positive voltage higher than the voltage upon the reset (i.e., the first voltage V1).

In this case, a satisfactory electric field fails to be applied to the channel of the transfer transistor MT, which can adversely affect the transfer of electrons from the photodiode PD to the floating diffusion FD. As an example, a potential barrier that hinders the transfer of electrons from the photodiode PD to the floating diffusion FD occurs in the channel of the transfer transistor MT, which can cause the electrons, which failed to be transferred to the floating diffusion FD, to remain in the photodiode PD.

On the other hand, according to the driving in the present technology, it is possible to transfer electrons using the transfer transistor MT in the state where the potential of the P-type semiconductor region 64 in which the transfer transistor MT is disposed is fixed to the voltage upon the reset (i.e., the first voltage V1). Thus, it is possible to apply a satisfactory electric field to the channel of the transfer transistor MT, improving the ability to transfer electrons from the photodiode PD to the floating diffusion FD using the transfer transistor MT, as compared with the driving disclosed in Non-Patent Document 1. Further, this makes it possible to reduce the unsatisfactory situation in which the electrons that failed to be transferred to the floating diffusion FD remain in the photodiode PD. Thus, according to the driving in the present technology, it is possible to satisfactorily read out the charge generated by photoelectric conversion, obtaining a high-quality image.

Furthermore, according to the driving in the present technology described above, the second voltage V2 supplied to the pixel 2 is changed from the high voltage $\text{VDD}_H$ to the low voltage $\text{VDD}_L$ lower than the high voltage $\text{VDD}_H$ during the storage period other than the readout operation and the reset operation, specifically, during the period from time t4 to time t11. The effect of setting the second voltage V2 to a voltage lower than the high voltage $\text{VDD}_H$ during the above period is described.

In the pixel 2 of the present technology, the first reset transistor MR1 is brought into a non-conductive state, putting the P-type semiconductor region 64 (node N1 in FIG. 2), which is one electrode of the first capacitor C1, to a floating state, and then the charge storage operation is performed. In other words, the pixel 2 stores the holes, which generated by the photodiode PD during the storage period, in the first capacitor C1.

However, an N-type semiconductor region to which a potential different from that of the P-type semiconductor region 64 is applied is placed adjacent to the P-type semiconductor region 64 which is one of electrodes of the first capacitor C1, and a PN junction is formed at the boundary between them. For example, the junction between the N-type semiconductor region 67 and the P-type semiconductor region 64 in FIG. 3, which is the drain region of the second reset transistor MR2 to which the second voltage supply wiring 32 is connected, corresponds to the PN junction. When electron-hole pairs are generated in a depletion layer region of this PN junction, for example, by thermal excitation, the generated holes will be stored in the first capacitor C1. The holes stored by this phenomenon have a possibility of deteriorating the characteristics of the pixel 2 as dark current fixed pattern noise of the pixel 2.

Thus, the occurrence of dark current in the PN junction between the N-type semiconductor region 67 to which the second voltage supply wiring 32 is connected and the P-type semiconductor region 64, which is one electrode of the first capacitor C1, is reduced. Thus, the solid-state imaging device 1 performs the driving so that the second voltage V2 given to the pixel 2 by the second voltage supply wiring 32 is changed in response to the operation of the pixel 2.

Specifically, the second voltage V2 is set to the high voltage $\text{VDD}_H$ during the period from time t1 to time t4 to reset the photodiode PD and the floating diffusion FD. During from time t4 after the end of the reset operation to time t11 before the start of the readout operation, the second voltage V2 is set to the low voltage $\text{VDD}_L$. During this period, the pixel 2 is executing the storage operation. Then, after time t11, the second voltage V2 is set to the high voltage $\text{VDD}_H$ to perform the transfer and readout operations.

The second voltage V2 of the second voltage supply wiring 32 connected to the N-type semiconductor region 67 is set to the low voltage $\text{VDD}_L$ during the period from time t4 to time t11 in which the storage operation is being executed. Thus, it is possible to reduce the occurrence of dark current in the PN junction between the N-type semiconductor region 67 and the P-type semiconductor region 64.

For example, given that the high voltage $VDD_H$ is 3.0 V and the low voltage $VDD_L$ is 1.5 V, the voltage applied to the PN junction is halved, so the electric field applied to the depleted portion is also halved accordingly, allowing the occurrence of dark current to be efficiently reduced. Moreover, the high voltage $VDD_H$, which is the second voltage V2 during the readout operation and the reset operation, is only required to be set higher as long as it is higher than the low voltage $VDD_L$ by the amount of potential change generated when the maximum charge is stored in the first capacitor C1. For example, there can be a case where the amount of increase in the potential of the P-type semiconductor region 64 is 1.0 V by storing the holes in the first capacitor C1 to the maximum where the second voltage V2 is the ground GND (0 V) during the storage period other than the readout and reset operations. In this case, it is possible to set the high voltage $VDD_H$ during the exposure period to 1.0 V.

<4. Numerical Example>

Figure 6:
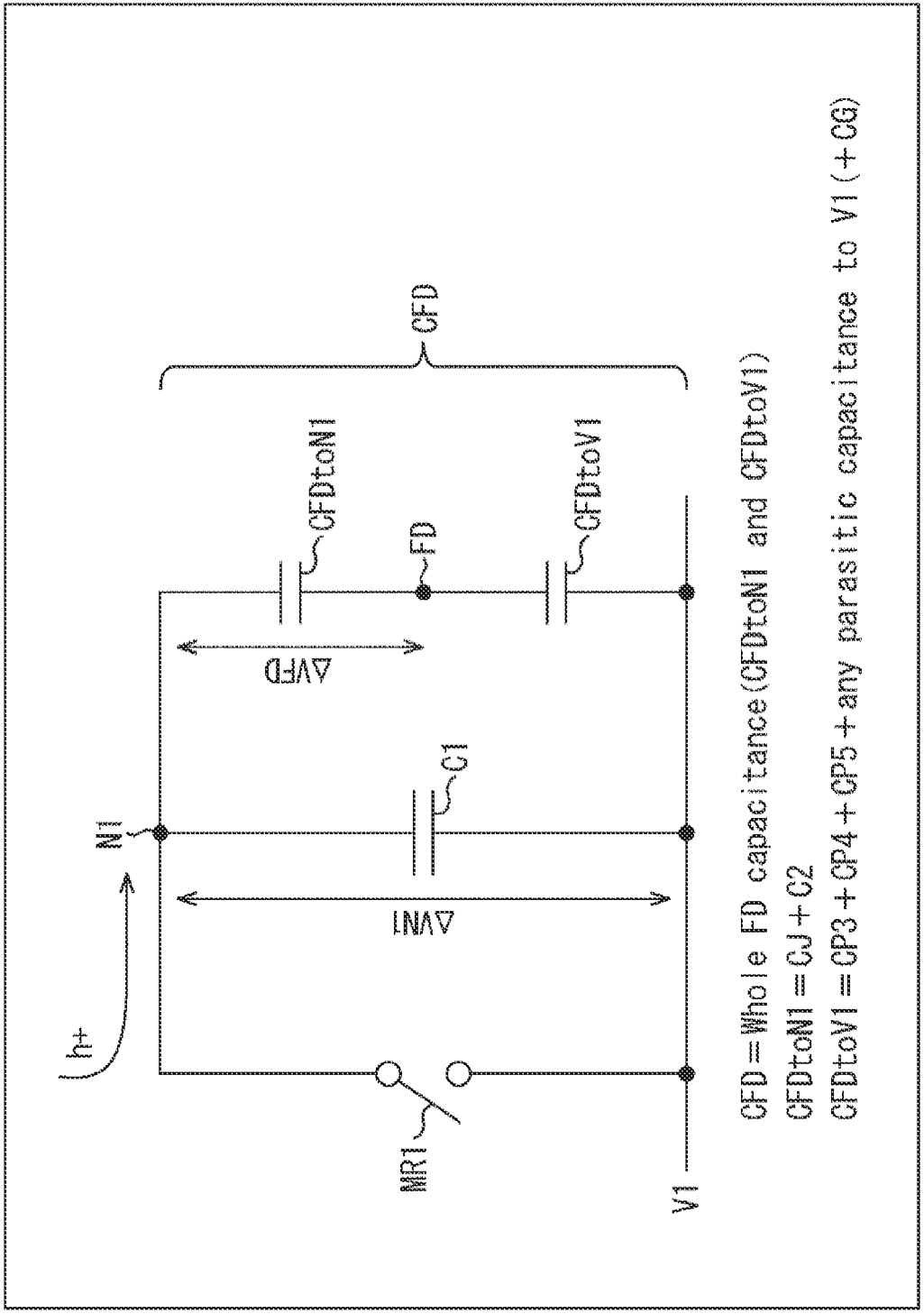
FIG. 6 is a diagram illustrated to describe a specific example of the number of charges stored in a pixel.

The description is given of how much the potential of the P-type semiconductor region 64 and the floating diffusion FD when the holes generated by the storage operation performed by the pixel 2 are stored in the first capacitor C1 with reference to FIGS. 2 and 6 using specific numerical values.

FIG. 6 is a diagram illustrating only device components necessary to calculate the potentials of the node N1 and the floating diffusion FD from FIG. 2. In this description, the FD capacitance CFDtoN1 relevant to node N1 is the capacitance connected between the floating diffusion FD and the node N1, and specifically, it is the combined capacitance of the junction capacitance CJ and the second capacitor C2. The FD capacitance CFDtoV1 relevant to the first voltage V1 is the capacitance connected between the floating diffusion FD and a region to be the first voltage V1. Specifically, it is the combined capacitance of the third capacitor CP3 to the fifth capacitor CP5 and the capacitance relevant to the first voltage V1 other than the third to fifth capacitors. The total capacitance CFD of the floating diffusion FD is the combined capacitance of the FD capacitance CFDtoN1 relevant to node N1 and the FD capacitance CFDtoV1 relevant to the first voltage V1.

The assumptions below are used in the calculation of numerical values. It is assumed that the magnitude CCFD of the total capacitance CFD of the floating diffusion FD is 2.5 fF, of which the magnitude CCFDtoN1 of FD capacitance CFDtoN1 relevant to node N1 is 1.36 fF. It is assumed that, in the magnitude CCFD, the magnitude CCJ of the junction capacitance CJ of the PN junction of the floating diffusion FD is 0.36 fF and the magnitude CC2 of the capacitance of the second capacitor C2 is 1 fF. Moreover, the magnitude CC2 of the capacitance of the second capacitor C2 is preferably 20% to 80% of the magnitude CCFD of the total capacitance CFD of the floating diffusion FD. Thus, in this description, the magnitude CCFD of the total capacitance CFD of the floating diffusion FD is 2.5 fF, and the magnitude CC2 of the capacitance of the second capacitor C2 is 1 fF. Furthermore, assuming that the magnitude CCG of the gate capacitance CG of the conversion gain switching transistor MG whose connection and separation to the floating diffusion FD is controlled by the switching signal φG is 10 fF, and the magnitude CC1 of the capacitance of the first capacitor C1 is 100 fF.

Further, it is assumed that electrons can be stored up to 30000 [e] in the photodiode PD, and holes can be stored up to 1000000 [h] in the first capacitor C1. It is assumed that electrons can be stored up to 10000 [e] in the floating diffusion FD in a high conversion gain state, and electrons can be stored up to 30000 [e] or more in the low conversion gain state.

In the high conversion gain state in which the gate capacitance CG of the conversion gain switching transistor MG is separated from the floating diffusion FD, the total capacitance CFD of the floating diffusion FD is 2.5 fF, and the elementary charge is $1.6 \times 10^{-19}$ C. Thus, the high conversion gain (output voltage per electron) in the electron readout is $1.6 \times 10^{-19}/2.5 \times 10^{-15} = 64$ μV/e. In the low conversion gain state in which the gate capacitance CG of the conversion gain switching transistor MG is connected to the floating diffusion FD, the total capacitance CFD of the floating diffusion FD is 12.5 fF. Thus, the low conversion gain (output voltage per electron) in the electron readout is $1.6 \times 10^{-19}/12.5 \times 10^{-15} = 13$ μV/e.

Upon the electrons readout, electrons can be stored up to 10000 [e] in the floating diffusion FD in the high conversion gain state, so a potential change of up to $64 \times 10^{-6} \times 10000 = 640$ mV appears in the floating diffusion FD in the high conversion gain state. In the low conversion gain state, the maximum number of electrons of 30000 [e] that can be stored in the photodiode PD can be stored in the floating diffusion FD. Thus, in the low conversion gain state, a potential change of up to $13 \times 10^{-6} \times 30000 = 390$ mV appears in the floating diffusion FD.

For holes, holes of up to 1000000 [h] can be stored in the first capacitor C1, so when holes are generated by photoelectric conversion in the photodiode PD, a charge of up to $1.6 \times 10^{-19} \times 1000000 = 160$ fC is given to the node N1. The magnitude of the first capacitor C1 is 100 fF, so the maximum potential change that appears at the node N1 is $160 \times 10^{-15}/100 \times 10^{-15} = 1600$ mV.

Upon the readout of holes, in the high conversion gain state, the magnitude CCFD of the total capacitance CFD of the floating diffusion FD is 2.5 fF, and the magnitude CCFDtoN1 of the FD capacitance CFDtoN1 relevant to node N1 is 1.36 fF. Thus, in the case where a potential change of up to 1600 mV appears in the node N1, a potential change of up to $1600 \times 1.36 \times 10^{-15}/2.5 \times 10^{-15} = 870$ mV appears in the floating diffusion FD. In the low conversion gain state, the magnitude CCFD of the total capacitance CFD of the floating diffusion FD is 12.5 fF, and the magnitude CCFDtoN1 of the FD capacitance CFDtoN1 relevant to node N1 is 1.36 fF. Thus, in the case where a potential change of up to 1600 mV appears in the node N1, a potential change of up to $1600 \times 1.36 \times 10^{-15}/12.5 \times 10^{-15} = 170$ mV appears in the floating diffusion FD. The potential change described above appears for holes of 1000000 [h], so the high conversion gain in the hole readout is $870 \times 10^{-3}/1000000 = 0.87$ μV/h, and the low conversion gain is $170 \times 10^{-3}/1000000 = 0.17$ μV/h.

In summary, for the floating diffusion FD, the electron potential change of up to 640 mV appears in the high conversion gain state, and the electron potential change of up to 390 mV appears in the low conversion gain state. The hole potential change of up to 870 mV appears in the high conversion gain state, and the hole potential change of up to 170 mV appears in the low conversion gain state.

According to the pixel structure of FIGS. 2 to 4, it is possible for the storage operation using holes to store more charges than the storage operation using electrons. In addition, it is possible for the readout operation using holes to reduce the charge conversion gain lower than the readout operation using electrons. In the case where a large number of holes are stored in the pixel 2, if the charge-to-voltage conversion is performed in this state, there is a possibility that the input range of the pixel signal Vsig input from the pixel 2 to an A/D conversion circuit (column signal processing circuit 5) is too large. According to the pixel structure of FIGS. 2 to 4, even in the case where a large number of holes are stored in the pixel 2, it is possible to reduce the hole conversion gain lower, thereby reducing the input range of the pixel signal Vsig to the A/D conversion circuit for its input.

Further, for a subject to be captured, there can be a case in which a region where the subject's luminance is low and a region where the subject's luminance is high coexist. In this case, according to the pixel structure of FIGS. 2 to 4, it is possible to output a hole readout signal having gradation even if the electron readout signal is saturated and the gradation is lost in the pixel 2 in which the high luminance region is captured. On the other hand, in the pixel 2 in which the low luminance region is captured, even if the output range of the hole readout signal is small and the gradation is poor, it is possible to output the electron readout signal with a large output range and a rich gradation. Then, if the dark random noise level (noise floor) of the electron readout signal is 1.0 [e] and the maximum hole storage amount is 1000000 [h], even under the condition that the electrons and holes are set to the same storage time, it is possible to obtain a high dynamic range signal. Specifically, it is possible to obtain a high dynamic range signal with a response of 120 dB (=20 $\log_{10}$ (1000000 [h]/1.0 [e])) to the incident light in the voltage amplitude range of a practical floating diffusion FD (i.e., the input range where the A/D conversion circuit in the subsequent stage can easily perform A/D conversion).

<5. Detailed Structure of First Reset Transistor MR1>

By the way, in a solid-state imaging device, if both NMOS transistor and PMOS transistor are arranged in a pixel, it is necessary to form a well for each of them, which causes a decrease in the integration density of pixels. This decrease in the integration density is typically avoided by using only one of an NMOS transistor and a PMOS transistor in the solid-state imaging device. In the case where a photodiode PD that stores electrons is used, an NMOS transistor is typically used.

On the other hand, according to the solid-state imaging device 1 of the present technology, the transfer transistor MT, the amplification transistor MA, and the like employ the NMOS transistor, while the first reset transistor MR1 employs the PMOS transistor, except for the first reset transistor MR1, as described with reference to FIG. 2.

The effect of using the PMOS transistor for the first reset transistor MR1 is described with reference to FIGS. 7A, 7B, 7C, 7D, and 7E.

FIG. 7C illustrates a plan view and a cross-sectional view of the first reset transistor MR1 disposed in the pixel 2. As described with reference to FIG. 3, the first reset transistor MR1 is disposed on the front surface side (lower side in FIG. 3) of the semiconductor substrate 12. Thus, the plan view of FIGS. 7A, 7B, 7C, 7D, and 7E are top views of the front surface side of the semiconductor substrate 12, and the cross-sectional view of FIGS. 7A, 7B, 7C, 7D, and 7E are sectional views of the vicinity of the front surface side of the semiconductor substrate 12.

In FIGS. 7A, 7B, 7C, 7D, and 7E, FIG. 7A is a plan view of the first reset transistor MR1.

In FIGS. 7A, 7B, 7C, 7D, and 7E, FIG. 7B is a cross-sectional view taken along line Y-Y in portion FIG. 7A, and portion FIG. 7C is a cross-sectional view taken along line X-X in portion FIG. 7A. In FIGS. 7A, 7B, 7C, 7D, and 7E, FIG. 7D is a cross-sectional view taken along line Y'-Y' in portion FIG. 7A, and portion FIG. 7E is a cross-sectional view taken along the line X'-X' in portion FIG. 7A.

In FIGS. 7A, 7B, 7C, 7D, and 7E, the Y-Y cross-sectional view of FIG. 7B is the same as that near the first reset transistor MR1 in the sectional view of FIG. 3.

As illustrated in the plan view of portion FIG. 7A, the first reset transistor MR1 is placed at one corner of pixel 2 having a rectangular plane region. In portion FIG. 7A, the first reset transistor MR1 is placed at the upper right corner of four corners of the rectangular pixel 2. The insulating film 62 and the trench electrode 61 that constitutes the trench isolation 60 are placed outside the pixel boundary direction of the first reset transistor MR1.

In the plan view of portion FIG. 7A, the first reset transistor MR1 has the P-type semiconductor region 64 and the P-type semiconductor region 68 that sandwich a gate electrode MR1_G. The P-type semiconductor region 64 acts as a source region on one side of the gate electrode MR1_G. The P-type semiconductor region 68 acts as a drain region on the other side of the gate electrode MR1_G. A high-concentration (N+) N-type diffusion layer region 69' is provided adjacent to the P-type semiconductor region 68. This high-concentration (N+) N-type diffusion layer region 69' is a region that forms an electrical connection for applying an electric potential to the N-type well 69 provided in the first reset transistor MR1 that is a PMOS.

The front surface portion of the P-type semiconductor region 64 is higher in impurity concentration than the central portion of the semiconductor substrate 12, as illustrated in FIG. 3. Thus, also in portion FIG. 7A, the P-type semiconductor region 64 as a source region is marked as P+ to indicate a high-concentration P-type semiconductor region. The P-type semiconductor region 68 as a drain region is also a high-concentration (P+) P-type semiconductor region. In portion FIG. 7A, the P-type semiconductor region 68 as a drain region is surrounded by the insulating film 62 for trench isolation on the upper and right side surfaces, the gate electrode MR1_G on the left side surface, and the high-concentration (N+) N-type diffusion layer region 69' on the lower side surface. Thus, the P-type semiconductor region 68 is electrically separated from the P-type semiconductor region 64 as a source region.

The drain region of a typical MOS transistor has three sides surrounded by a device separation region and one side surrounded by a gate electrode, allowing it to be electrically separated from the source region and other devices. However, the first reset transistor MR1 illustrated in FIGS. 7A, 7B, 7C, 7D, and 7E, unlike a typical MOS transistor, has the N-type diffusion layer region 69' used to electrically connected to the N-type well 69 on the lower side surface. Thus, the P-type semiconductor region 68 as the drain region can be electrically separated from the P-type semiconductor region 64 as the source region without placing the device separation region on the lower side. The use of a layout in which the isolation region placed adjacent to the P-type semiconductor region 68 as the drain region is reduced to only the upper and right sides of the drain region allows the first reset transistor MR1 of the present technology to be smaller in area than the typical MOS transistor.

As illustrated in the cross-sectional views of FIGS. 7B, 7C, 7D, and 7E, the P-type semiconductor region 68 acting as the drain region of the first reset transistor MR1 is placed in the N-type well 69 and is electrically separated from the P-type semiconductor region 64 acting as the source region.

The first reset transistor MR1 is formed with the PMOS transistor inside the N-type well 69 placed in the P-type semiconductor region 64. However, unlike a typical PMOS transistor, the P-type semiconductor region 64 placed outside the N-type well 69 is utilized as a source region. This structure eliminates the need to form a source region in the N-type well 69 and also eliminates the need to secure an area necessary for forming an electrical connection in the source region. Thus, the smaller area than a typical PMOS transistor as well as the smaller area of the first reset transistor MR1 makes it possible to increase the area necessary for the photodiode PD or the amplification transistor MA instead. This makes it possible to improve the number of saturated electrons in the pixel 2 and the performance of dark random noise.

Moreover, the first reset transistor MR1 can be placed at a place other than one corner of the pixel 2 having a rectangular plane region, for example, at a predetermined side of the rectangle.

<6. Dark Current Correction Processing>

As described above, in the pixel 2 according to the present technology, the drain region of the second reset transistor MR2, which is an N-type semiconductor region, is placed adjacent to the P-type semiconductor region 64, which is one electrode of the first capacitor C1. Thus, there is a possibility of occurring a dark current at this PN junction.

Thus, the solid-state imaging device 1 is capable of performing dark current correction processing for correcting dark current in the signal processing circuit 7 in a stage following the column signal processing circuit 5 that outputs the pixel signals Sig1 to Sig4 after the correlated double sampling (CDS) processing.

Figure 8:
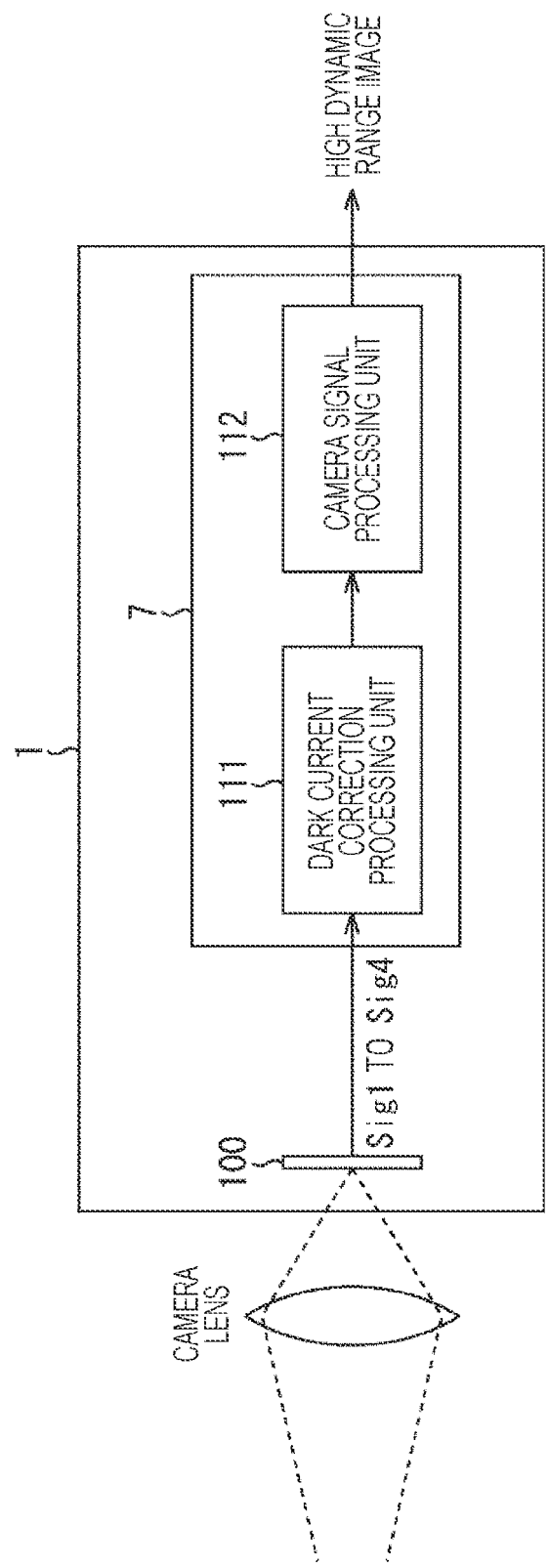
FIG. 8 is a block diagram of a solid-state imaging device with attention to a signal processing circuit.

FIG. 8 is a block diagram of a solid-state imaging device 1 with attention to a signal processing circuit 7.

The solid-state imaging device 1 includes a signal processing circuit 7 in a stage that follows a pixel array signal output unit 100.

The pixel array signal output unit 100 includes the pixel array section 3, the vertical driver 4, the column signal processing circuit 5, the horizontal driver 6, and the like, as illustrated in FIG. 1. The pixel array signal output unit 100 receives the incident light collected by the camera lens and outputs the pixel signals Sig1 to Sig4 of each pixel 2 after the correlated double sampling (CDS) processing.

The signal processing circuit 7 includes a dark current correction processing unit 111 and a camera signal processing unit 112.

The dark current correction processing unit 111 performs dark current correction processing for correcting the dark current. The details of the dark current correction processing unit 111 will be described later.

The camera signal processing unit 112 performs predetermined signal processing, such as white balance correction, gain adjustment, and demosaicing, on the pixel signals Sig1 to Sig4 after the dark current correction. The camera signal processing unit 112 outputs the pixel signal as a high dynamic range image after the signal processing.

Figure 9:
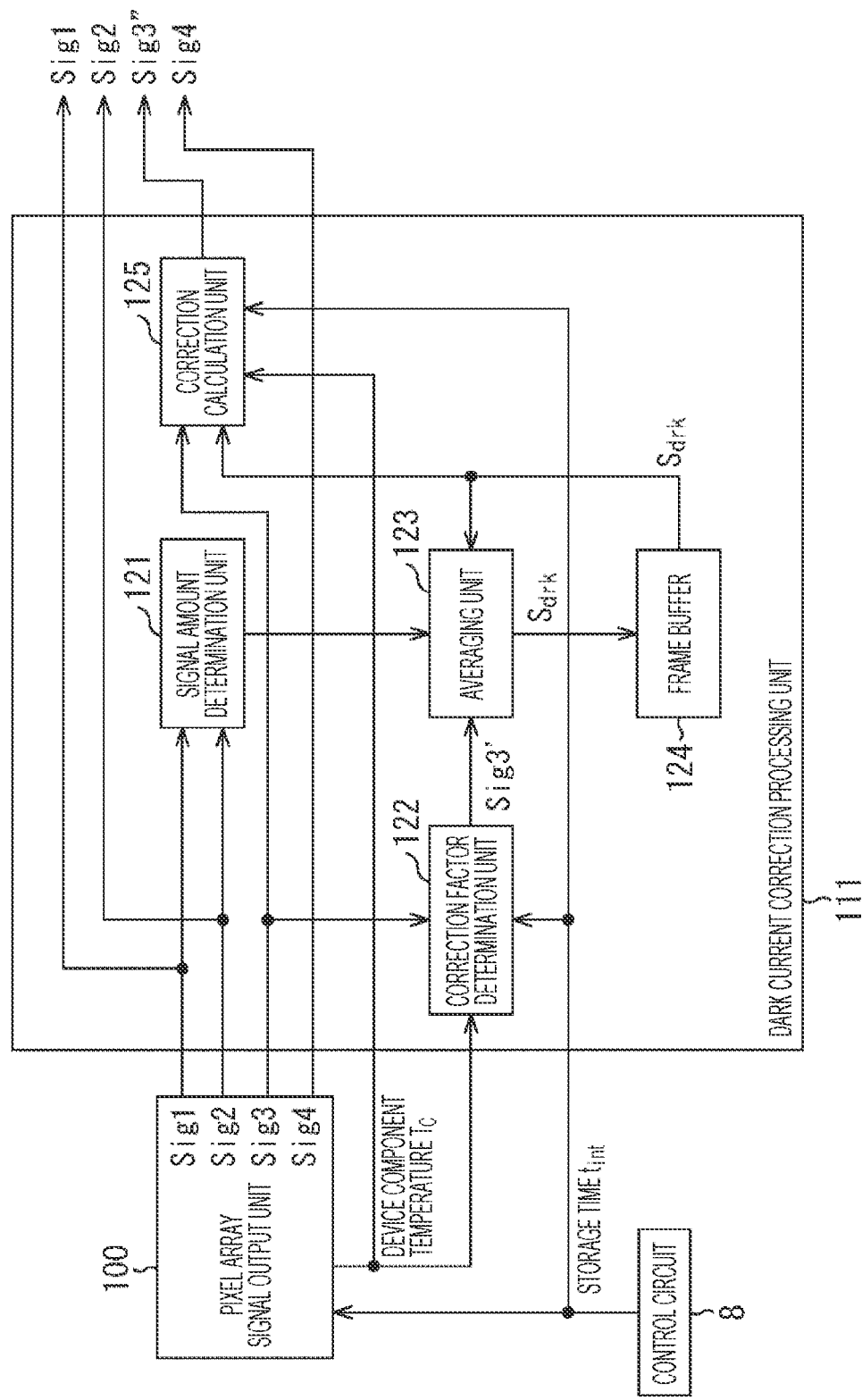
FIG. 9 is a block diagram illustrating a detailed configuration example of a dark current correction processing unit.

FIG. 9 is a block diagram illustrating a detailed configuration example of a dark current correction processing unit 111.

The dark current correction processing unit 111 includes a signal amount determination unit 121, a correction factor determination unit 122, an averaging unit 123, a frame buffer 124, and a correction calculation unit 125.

The control circuit 8 determines a storage time $t_{int}$ of each pixel 2 depending on the amount of received light or the like and supplies it to the pixel array signal output unit 100 and the dark current correction processing unit 111.

The pixel array signal output unit 100 performs a storage operation (imaging operation) on the basis of the storage time $t_{int}$ supplied from the control circuit 8. The pixel array signal output unit 100 supplies signals obtained by the storage operation, i.e., the high conversion gain pixel signal Sig1 caused by electrons, the low conversion gain pixel signal Sig2 caused by electrons, the high conversion gain pixel signal Sig3 caused by holes, and the low conversion gain pixel signal Sig4 caused by holes are supplied to the dark current correction processing unit 111.

Further, the pixel array signal output unit 100 detects the device temperature Tc upon the light reception and supplies it to the dark current correction processing unit 111.

The signal amount determination unit 121 is supplied with at least the pixel signal Sig1 (the high conversion gain pixel signal caused by electrons) from the pixel array signal output unit 100.

The signal amount determination unit 121 determines whether or not the subject captured by each pixel 2 is a dark subject. Specifically, the magnitude of the pixel signal Sig1 (the high conversion gain pixel signal caused by electrons) output by each pixel 2 is determined whether or not it is smaller than a predetermined threshold (i.e., a threshold for determining that the subject is dark).

In a case where it is determined that the magnitude of the pixel signal Sig1 (the high conversion gain pixel signal caused by electrons) is smaller than the predetermined threshold, it is determined that the pixel 2 that outputs the signal has captured a dark subject.

Further, in a case where the signal amount determination unit 121 determines that the pixel 2 has captured a dark subject, the pixel signal Sig3 (the high conversion gain pixel signal caused by holes) output by the pixel 2 has a magnitude in which the signal caused by holes generated by photoelectric conversion can be ignored. It is determined that the pixel signal Sig3 is that most of the dark current.

In this way, the signal amount determination unit 121 determines whether or not the pixel signal Sig3 (the high conversion gain pixel signal caused by holes) output by each pixel 2 can be regarded as substantially dark current and supplies the determination result to the averaging unit 123.

The correction factor determination unit 122 is supplied with the pixel signal Sig3 (the high conversion gain pixel signal caused by holes) output by each pixel 2, a storage time $t_{int}$ upon obtaining the signal, and a device temperature Tc.

The pixel signal Sig3 (the high conversion gain pixel signal caused by holes) input from each pixel 2 to the correction factor determination unit 122 does not necessarily have the same storage time $t_{int}$ and device temperature Tc. Thus, the correction factor determination unit 122 determines a correction factor K. The correction factor K is used to correct the pixel signal Sig3 (the high conversion gain pixel signal caused by holes) captured with different storage times $t_{int}$ and device temperatures Tc to a pixel signal Sig3' (the high conversion gain pixel signal caused by holes with corrected device temperature and storage time) captured with a storage time $t_{int}$ and device temperature Tc as a certain reference.

For example, it is assumed that the correction factor determination unit 122 has the device temperature of 60° C. as a reference and the storage time of 1/30 seconds, and the magnitude of the dark current doubles with a temperature rise of 7° C. and is proportional to the storage time. Using such assumption, the correction factor determination unit 122 determines, for example, the correction factor K to 2 (K=2) for a signal having a device temperature Tc of 60° C. and a storage time $t_{int}$ of 1/15 seconds upon the imaging. In addition, for example, the correction factor determination unit 122 determines the correction factor K to 1/4 (K=1/4) for a signal having a device temperature Tc of 53° C. and a storage time $t_{int}$ of 1/60 seconds upon the imaging.

The correction factor determination unit 122 multiplies, by the correction factor K, the pixel signal Sig3 (high conversion gain pixel signal caused by holes) of each pixel supplied from the pixel array signal output unit 100 to the correction factor determination unit 122. The correction factor determination unit 122 supplies the signal obtained by the multiplication, that is, the pixel signal Sig3' with the corrected device temperature Tc and storage time $t_{int}$, to the averaging unit 123.

In the case where the signal amount determination unit 121 considers the pixel signal Sig3 (the high conversion gain pixel signal caused by holes) as dark current, the averaging unit 123 performs averaging processing of the pixel signal Sig3' over a plurality of frames. In this case, the pixel signal Sig3' is the signal (the high conversion gain pixel signal caused by holes with the corrected device temperature Tc and storage time $t_{int}$) supplied from the correction factor determination unit 122. The pixel signal Sig3' in one frame includes dark current shot noise. The averaging unit 123 removes dark current shot noise and extracts a dark current fixed pattern noise signal Sdrk by averaging the pixel signal Sig3' over a plurality of frames. The averaging unit 123 stores the extracted dark current fixed pattern noise signal Sdrk in the frame buffer 124.

More specifically, the averaging processing is performed for a pixel signal considered as the dark current by the signal amount determination unit 121 among the pixel signals Sig3' (the high conversion gain pixel signal caused by holes with the corrected device temperature and storage time) supplied from the correction factor determination unit 122 to the averaging unit 123. Specifically, the averaging unit 123 performs the averaging processing on the pixel signal Sig3' over a plurality of frames by using a simple moving average, a weighted moving average, an exponential moving average, or the like (i.e., calculate an average value over multiple frames). The signal obtained by the averaging processing is the dark current fixed pattern noise signal Sdrk caused by holes. The averaging unit 123 stores the dark current fixed pattern noise signal Sdrk in the frame buffer 124.

The correction calculation unit 125 performs calculation processing for correcting the dark current for the signal of each pixel 2 supplied from the pixel array signal output unit 100 to the correction calculation unit 125. In other words, the dark current fixed pattern noise signal Sdrk of the same pixel stored in the frame buffer 124 is subtracted from the pixel signal Sig3 (the high conversion gain pixel signal caused by holes) supplied to the correction calculation unit 125. The correction calculation unit 125 outputs a signal obtained by the subtraction processing, that is, a pixel signal Sig3" (the high conversion gain pixel signal caused by holes having the corrected dark current) after the dark current correction.

As described above, in a case where the pixel signal Sig1 (high conversion gain pixel signal caused by electrons) is smaller than a predetermined value, the dark current correction processing unit 111 calculates the dark current fixed pattern noise signal Sdrk (a fixed component) by using the pixel signal Sig3 (the high conversion gain pixel signal caused by holes) for a plurality of frames. The dark current correction processing unit 111 subtracts the calculated dark current fixed pattern noise signal Sdrk from the pixel signals Sig3 to generate the pixel signal Sig3" (the high conversion gain pixel signal caused by holes with the corrected dark current) from which the dark current fixed pattern noise is removed.

This dark current correction processing is suitable for pixel signals in the case where the subject is constantly moving like an in-vehicle camera and there is a chance to constantly capture a substantially dark subject on the entire surface of the imaging surface within a certain period of time.

Moreover, although the averaging unit 123 of the dark current correction processing unit 111 described above calculates the dark current fixed pattern noise by averaging in a plurality of frames, the dark current fixed pattern noise can be calculated using smoothing processing such as a median filter.

FIGS. 10A and 10B are diagrams illustrated to describe a dark current improvement effect produced by a dark current correction processing unit 111.

In FIGS. 10A and 10B, FIG. 10A shows the signal-to-noise (S/N) ratio of the pixel signals Sig1 to Sig4 of each pixel in the case where the dark current correction processing is not performed. In FIGS. 10A and 10B, FIG. 10B shows the S/N ratio of pixel signals Sig1 to Sig4 of each pixel in the case where the dark current correction processing is performed.

In each graph of FIGS. 10A and 10B, the horizontal axis represents the intensity of light (light received amount) incident on the pixel. Then, the horizontal axis of each graph of FIGS. 10A and 10B represents the signal to be output from the solid-state imaging device 1 by the imaging operation in the solid-state imaging device 1, using an optional unit in which the light intensity (light receive amount) for switching from the electron readout signal (Sig1 and Sig2) to the hole readout signal (Sig3 and Sig4) is set to 1. In each graph of FIGS. 10A and 10B, the vertical axis represents the S/N ratio with the dB unit.

The difference between FIGS. 10A and 10B is the pixel signal Sig3. The pixel signal Sig3 shown in portion FIG. 10A is the pixel signal Sig3 having a high conversion gain caused by holes that not subjected to the correction for the dark current. In contrast, the pixel signal Sig3 shown in portion FIG. 10B is the pixel signal Sig3" subjected to the correction.

In the light intensity (i.e., the value on the horizontal axis is 1) for switching the signal to be output from the solid-state imaging device 1 from the signal caused by electrons (Sig1 and Sig2) to the signal caused by holes (Sig3 and Sig4), the gap in the S/N ratio between the pixel signal Sig2 and the pixel signal Sig3 is large in (before the dark current correction processing) FIG. 10A. On the other hand, in (before the dark current correction processing) FIG. 10B, the gap in the S/N ratio between the pixel signal Sig2 and the pixel signal Sig3" is small. In other words, FIGS. 10A and 10B show that the S/N ratio is improved by performing the dark current correction processing.

Moreover, the gap in the S/N ratio between the pixel signal Sig2 and the pixel signal Sig3 before the dark current correction processing can also vary depending on a ratio of the magnitude CC2 of the capacitance of the second capacitor C2 to the magnitude CCFD of the total capacitance CFD of the floating diffusion FD (CC2/CCFD).

As described earlier, the ratio of the magnitude CC2 of the capacitance of the second capacitor C2 to the magnitude CCFD of the total capacitance CFD of the floating diffusion FD is preferably set between 0.2 times and 0.8 times. If this capacitance ratio is reduced so that it approaches 0, the gap in the S/N ratio between the pixel signal Sig2 and the pixel signal Sig3 is large. On the other hand, the increase in the capacitance ratio so that it approaches 1 for reducing the gap in the S/N ratio between the pixel signal Sig2 and the pixel signal Sig3 necessitates to increase the capacitance of the second capacitor C2. In other words, it is necessary for the second capacitor C2 to occupy most of the total capacitance CFD of the floating diffusion FD. The increase in the capacitance of the second capacitor C2 will increase the total capacitance CFD of the floating diffusion FD accordingly. This will decrease the conversion gain upon the high conversion gain or deteriorate the S/N ratio as a whole. Thus, the ratio of the magnitude CC2 of the capacitance of the second capacitor C2 to the magnitude CCFD of the total capacitance CFD of the floating diffusion FD is preferably set between 0.2 times and 0.8 times.

<7. Structure in which Polarities of Electrons and Holes are Reversed>

Assuming that the above-described embodiment is a first embodiment, in the first embodiment, electrons are stored in the photodiode PD, and holes are stored in the first capacitor C1, but a structure in which the polarities of electrons and holes are reversed is also possible.

The structure in which the polarities of electrons and holes are reversed to those of the first embodiment is described as a second embodiment.

Figure 11:
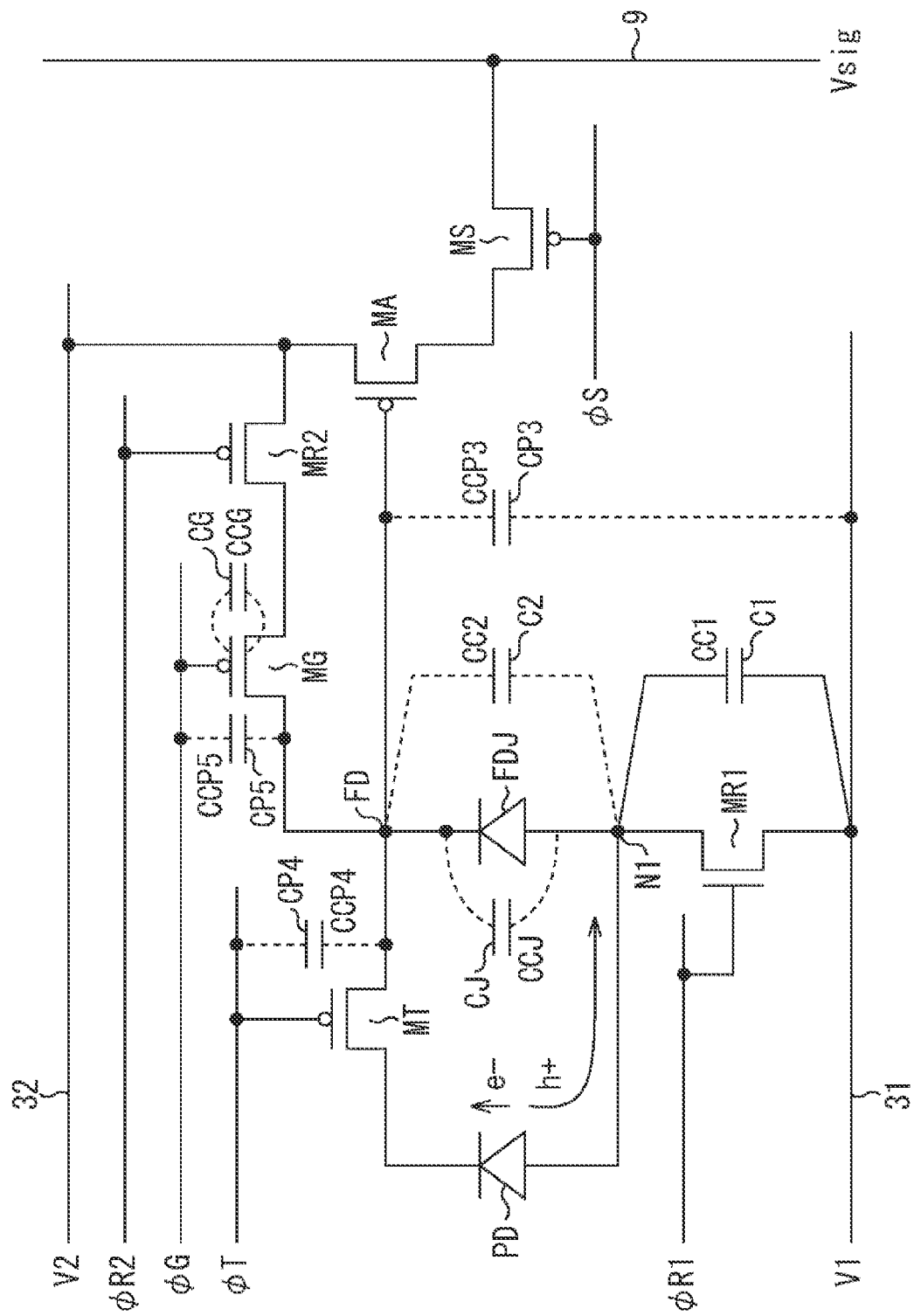
FIG. 11 is a diagram illustrating a circuit equivalent to a pixel according to a second embodiment.
Figure 12:
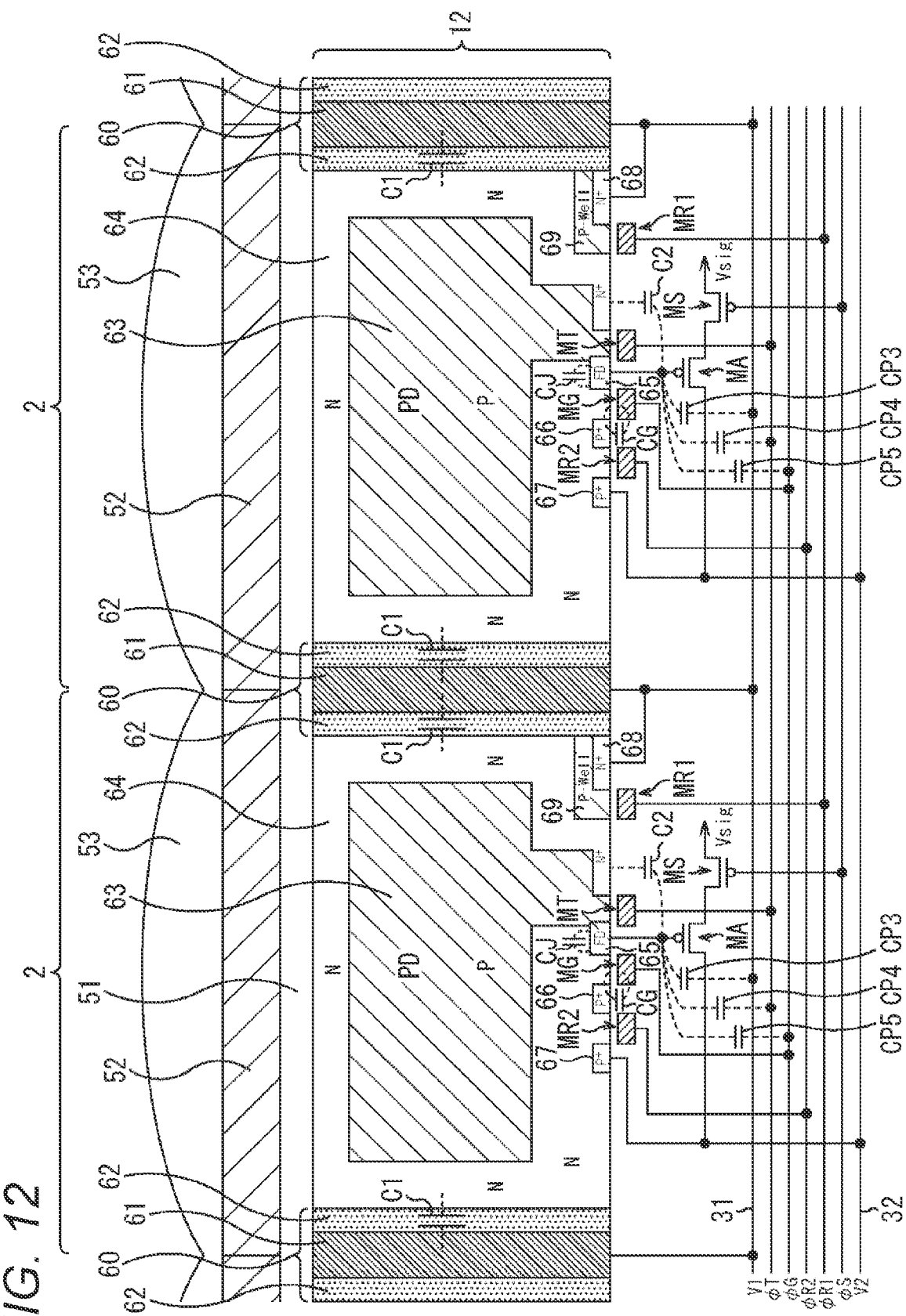
FIG. 12 is a diagram illustrating a cross-sectional structure of a pixel according to the second embodiment.

FIG. 11 illustrates a circuit equivalent to the pixel 2 in the second embodiment, and FIG. 12 illustrates a cross-sectional structure of the pixel 2 in the second embodiment. Furthermore, FIG. 13 is a timing chart illustrating the driving of the pixel 2 in the second embodiment.

The pixel circuit of FIG. 11 corresponds to the pixel circuit of FIG. 2 in the first embodiment. In the pixel circuit of FIG. 11, the PMOS transistor and the NMOS transistor are interchanged as compared with the pixel circuit of FIG. 2. Thus, the transfer transistor MT, the conversion gain switching transistor MG, the second reset transistor MR2, the amplification transistor MA, and the selection transistor MS are formed using a PMOS transistor, and the first reset transistor MR1 is formed using an NMOS transistor.

The pixel cross-sectional view of FIG. 12 corresponds to the pixel cross-sectional view of FIG. 3 in the first embodiment. In the pixel cross-sectional view of FIG. 12, the P-type and the N-type of the semiconductor region are interchanged as compared with the pixel cross-sectional view of FIG. 3.

Figure 5:
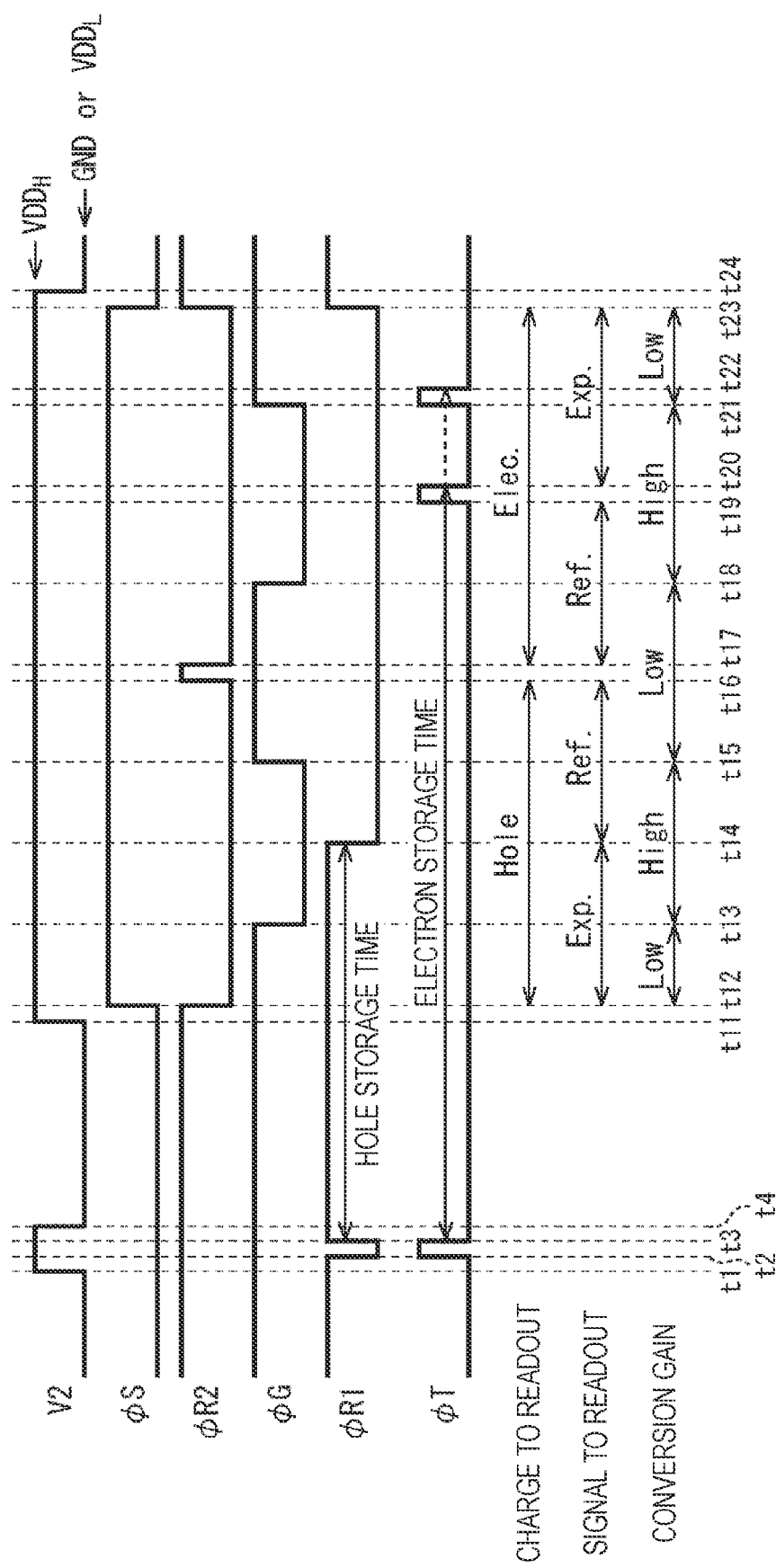
FIG. 5 is a chart showing the driving timing of pixels.
Figure 13:
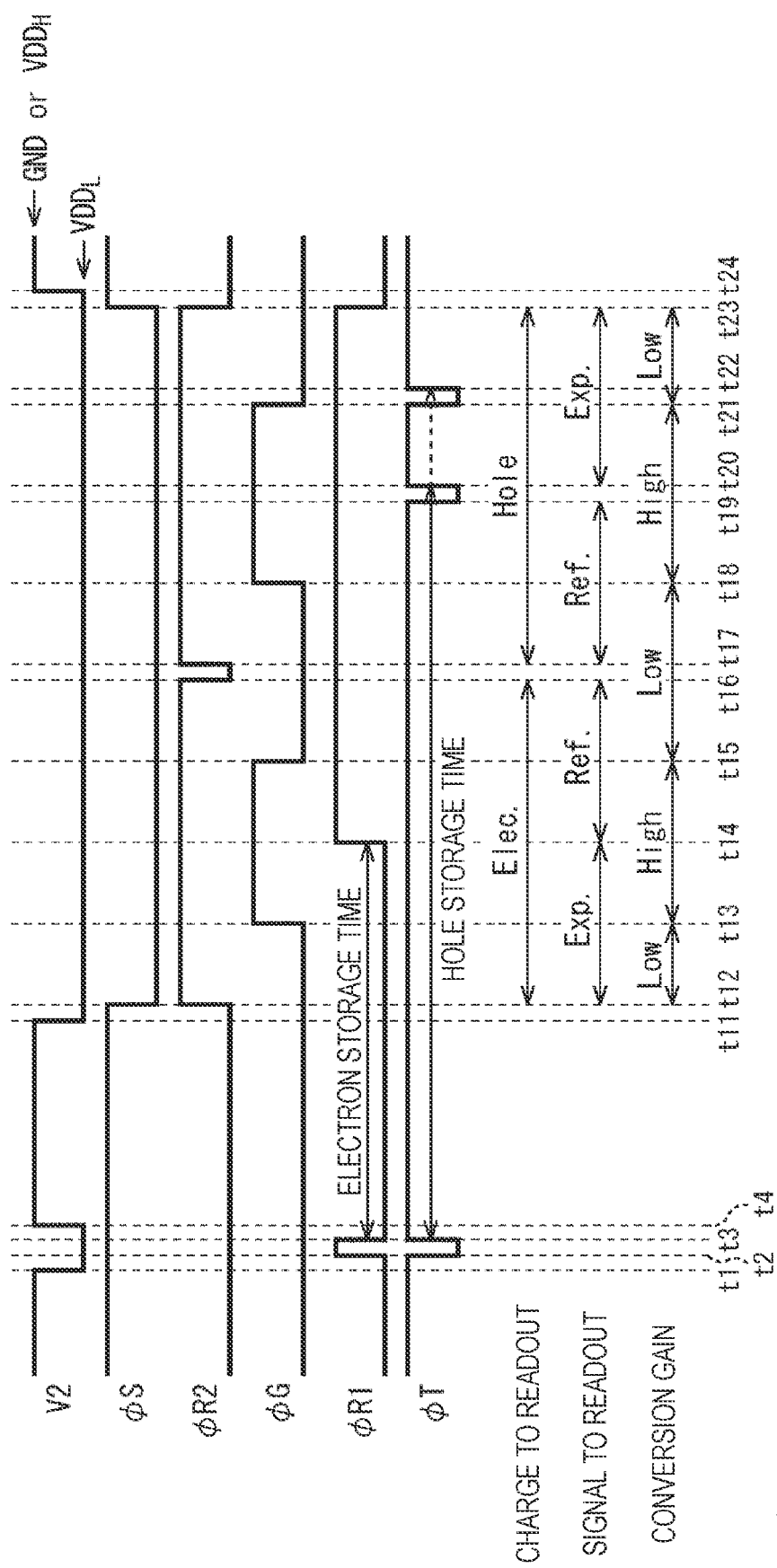
FIG. 13 is a chart showing driving timings of pixels according to the second embodiment.

The driving timing chart of FIG. 13 corresponds to the driving timing chart of FIG. 5 in the first embodiment. The driving timing chart of FIG. 13 has the polarities (High and Low) of the respective control signals are interchanged as compared with the driving timing chart of FIG. 5. In addition, as illustrated in FIG. 13, the signal caused by the electrons is read, and then the signal caused by the holes is read.

The second embodiment is similar to the first embodiment except for the points described above, so detailed descriptions related to FIGS. 11 to 13 are omitted. The second embodiment also achieves effects similar to those of the first embodiment.

<8. Other Structural Examples of Pixel Boundary Portion>

In the first and second embodiments described above, the configuration is employed in which the trench isolation 60 including the trench electrode 61 and the insulating film 62 is provided at a pixel boundary portion so that adjacent pixels 2 are electrically separated from each other.

As the configuration of the pixel separation portion that electrically separates adjacent pixels 2, the pixel separation can be achieved using the PN junction in addition to the configuration in which the trench isolation 60 including the trench electrode 61 and the insulating film 62 is provided.

Figure 14:
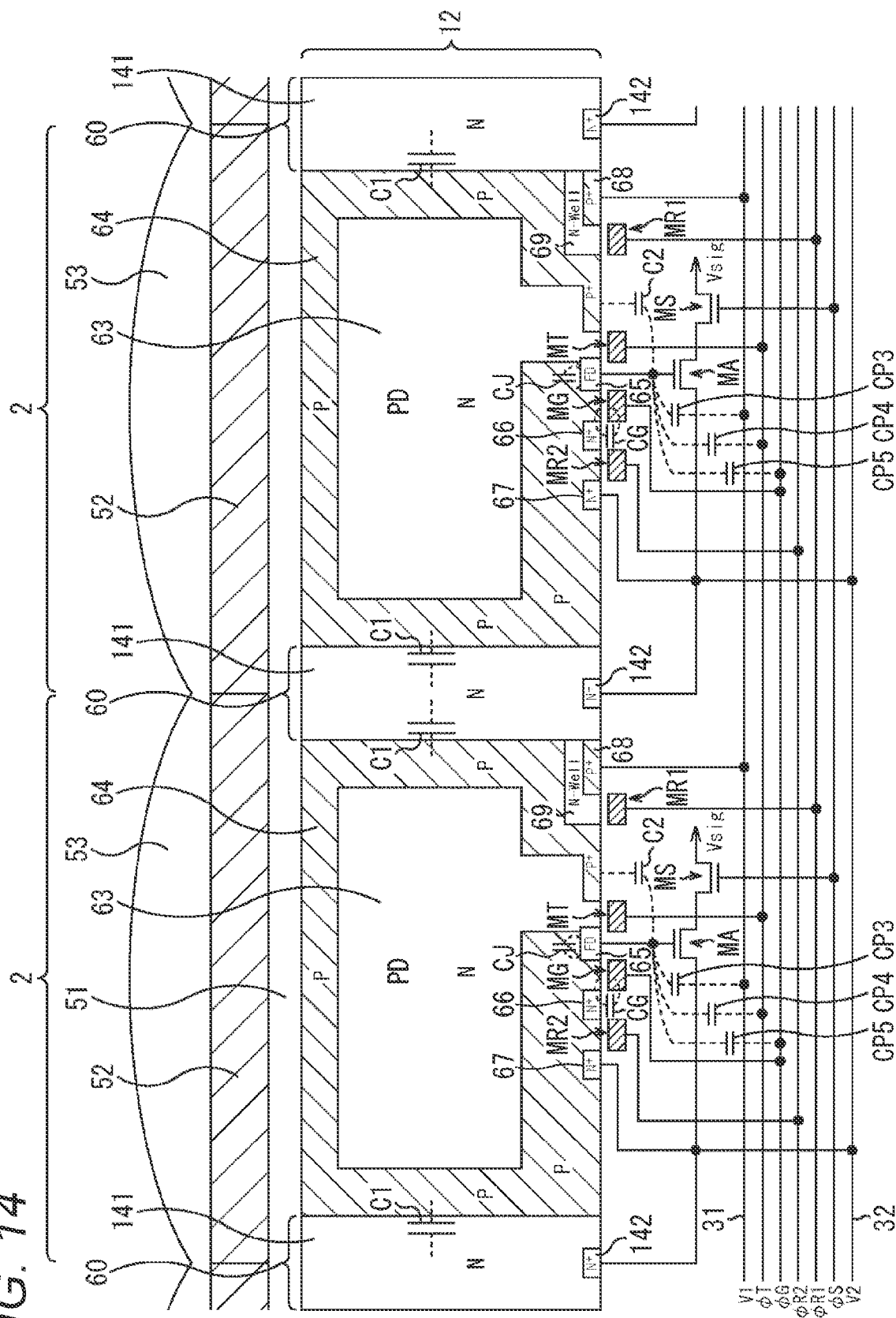
FIG. 14 is a diagram illustrating a cross-sectional structure of a pixel according to a third embodiment.

FIG. 14 is a diagram illustrating a cross-sectional structure of the pixel 2 having the structure in which the pixel separation portion using the PN junction achieves the electrical separation, which is a third embodiment of the solid-state imaging device 1.

In FIG. 14, the constituent components corresponding to the first embodiment illustrated in FIG. 3 are denoted by the same reference numerals, and the description of the components will be omitted as appropriate.

The third embodiment illustrated in FIG. 14 is different from the first embodiment illustrated in FIG. 3 in that the trench electrode 61 and the insulating film 62 according to the first embodiment are replaced with N-type semiconductor regions 141 and 142, and other configurations are the same as the first embodiment.

Specifically, in the third embodiment illustrated in FIG. 14, a P-type semiconductor region 64, which is one electrode of the first capacitor C1, and the N-type semiconductor region 141, which is a conductive type opposite thereto, are provided at the boundary portion of the pixels 2 arranged adjacent to each other. The N-type semiconductor region 141 is disposed to penetrate the semiconductor substrate 12, similar to the trench isolation 60. The N-type semiconductor region 142 having a higher impurity concentration than the N-type semiconductor region 141 as a contact portion is disposed in a part of the N-type semiconductor region 141 near the interface on the back surface side of the substrate. The second voltage V2 is supplied to the N-type semiconductor region 142 as the contact portion, and the N-type semiconductor region 141 and the P-type semiconductor region 64 are electrically insulated and separated in a reverse bias state of the PN junction. The PN junction capacitance between the N-type semiconductor region 141 and the P-type semiconductor region 64 corresponds to the first capacitor C1.

<9. Summary>

In the pixel 2 according to the embodiments of the solid-state imaging device 1 described above, the first charge (e.g., electrons) generated by photoelectric conversion of incident light is stored in the photodiode PD, and the second charge (e.g., holes) is stored in the first capacitor C1 provided in the pixel separation portion. In addition, the P-type semiconductor region 64 acting as the anode of the photodiode PD is one electrode of the first capacitor C1 that stores the second charge. Furthermore, the transfer transistor MT, which is an NMOS transistor, is also disposed in the P-type semiconductor region 64.

Then, each pixel 2 outputs a pixel signal caused by the second charge stored in the first capacitor C1 and then outputs a pixel signal caused by the first charge stored in the photodiode PD. The use of this readout order makes it possible to fix the potential of the P-type semiconductor region 64 in which the transfer transistor MT is disposed to the ground GND in transferring the first charge from the photodiode PD to the floating diffusion FD using the transfer transistor MT.

This achieves the effect that the first charge can be transferred satisfactorily in transferring the first charge from the photodiode PD to the floating diffusion FD, as compared with the related art in which the potential of the P-type semiconductor region 64 having the transfer transistor MT disposed therein rises from the ground GND to the positive potential.

The first reset transistor MR1 used to reset the P-type semiconductor region 64, which is one electrode of the first capacitor C1 for storing the second charge, is constituted using a PMOS transistor in a case where the second charge is holes and is constituted using an NMOS transistor in a case where the second charge is electrons.

The P-type semiconductor region 64, which is one electrode of the first capacitor C1 that stores the second charge, and the first reset transistor MR1 for resetting the first capacitor C1 can be made to have the same conductive type. Thus, it is possible for the P-type semiconductor region 64 to act as one electrode of the first capacitor C1 and the source region of the first reset transistor MR1. This makes it possible to reduce the area of the source region of the first reset transistor MR1 and reduce the area of the first reset transistor MR1. Thus, it is possible to achieve the effect of improving the characteristics of the pixel 2 by reducing the area of the pixel 2, or increasing the area of the photodiode PD or the amplification transistor MA instead of reducing the area of the pixel 2.

Further, lowering the power supply voltage supplied to the pixel 2 during the charge storage period in the pixel 2 makes it possible to achieve the effect of preventing the dark current from being generated in the pixel 2.

Furthermore, the signal processing circuit 7 provided in the solid-state imaging device 1 determines whether or not the subject captured by each pixel 2 is dark on the basis of the readout signal of the first charge from each pixel 2. For the pixel 2 in which the captured subject is determined to be dark, the signal processing circuit 7 determines that the second charge readout signal from the pixel 2 is the dark current rather than a signal generated by photoelectric conversion. Then, the signal processing circuit 7 uses the signal determined to be the dark current to perform correction processing for removing the dark current from the readout signal of the second charge from the pixel 2. This achieves the effect that the S/N ratio of the pixel signal caused by the second charge can be improved.

<10. Examples of Application to Electronic Apparatus>

The present technology is not necessarily applied to a solid-state imaging device. Specifically, the present technology can be applied to any electronic apparatus using a solid-state imaging device as an image capturing unit (a photoelectric conversion unit), such as an imaging device like a digital still camera or a video camera, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 15:
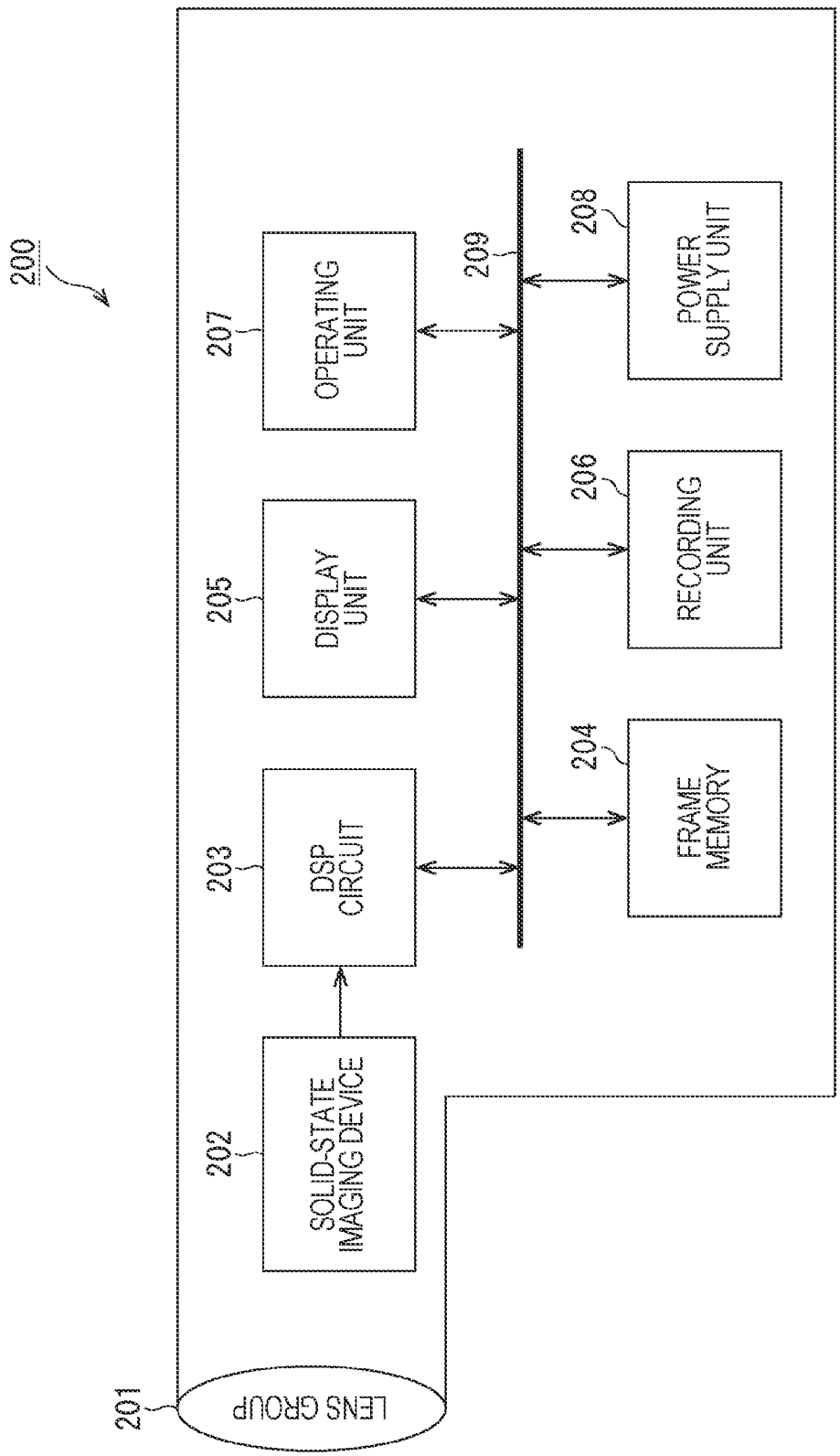
FIG. 15 is a block diagram illustrating a configuration example of an imaging device as an electronic apparatus to which the present technology is applied.

FIG. 15 is a block diagram illustrating a configuration example of an imaging device as an electronic apparatus to which the present technology is applied.

The imaging device 200 shown in FIG. 15 includes an optical unit 201 formed with lenses and the like, a solid-state imaging device (an imaging device) 202 having the configuration of the solid-state imaging device 1 shown in FIG. 1, and a digital signal processor (DSP) circuit 203 that is a camera signal processing circuit. Further, the imaging device 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to one another via a bus line 209.

The optical unit 201 gathers incident light (image light) from an object and forms an image on the imaging surface of the solid-state imaging device 202. The solid-state imaging device 202 converts the amount of the incident light, which has been gathered as the image on the imaging surface by the optical unit 201, into an electrical signal for each pixel, and outputs the electrical signal as a pixel signal. As this solid-state imaging device 202, the solid-state imaging device 1 in FIG. 1, that is, a solid-state imaging device that achieves high dynamic range imaging by detecting both electrons and holes, can be used.

The display unit 205 is formed with a flat-panel display such as a liquid crystal display (LCD) or an organic electroluminescence (EL) display, for example, and displays a moving image or a still image formed by the solid-state imaging device 202. The recording unit 206 records the moving image or the still image formed by the solid-state imaging device 202 on a recording medium such as a hard disk or a semiconductor memory.

When operated by a user, the operation unit 207 issues operating instructions as to various functions of the imaging device 200. The power supply unit 208 supplies various power sources as the operation power sources for the DSP circuit 203, the frame memory 204, the display unit 205, the recording unit 206, and the operation unit 207, as appropriate.

As described above, the use of the solid-state imaging device 1 to which the above-described embodiment is applied as the solid-state imaging device 202 makes it possible to generate an image having a high dynamic range. Thus, the image quality of the captured image can be improved even in the imaging device 200 such as a video camera, a digital still camera, and a camera module for mobile devices such as mobile phones.

<Examples of use of Image Sensor>

Figure 16:
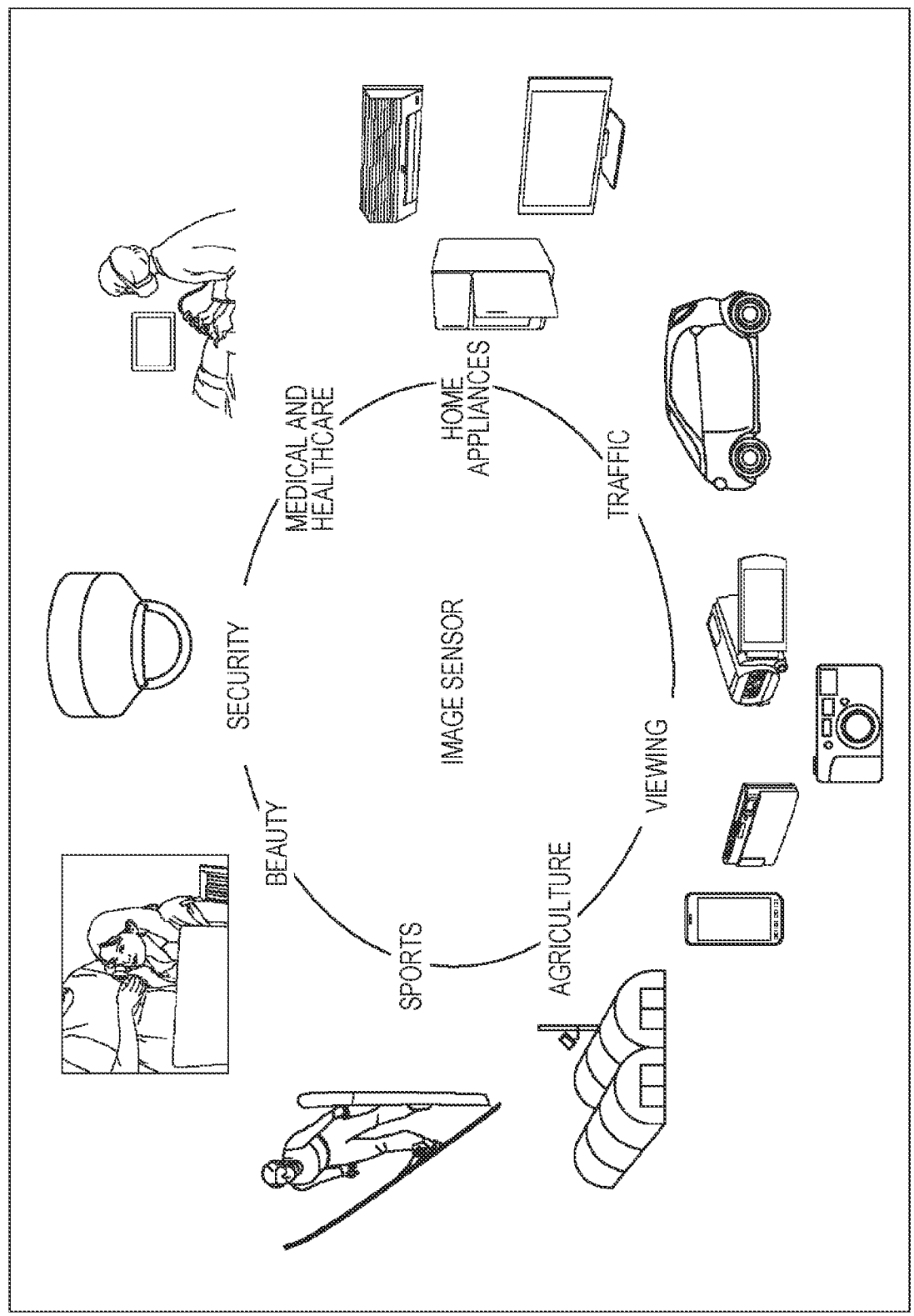
FIG. 16 is a diagram illustrating a use example of an image sensor.

FIG. 16 is a diagram showing examples of use of an image sensor using the above described solid-state imaging device 1.

An image sensor using the above described solid-state imaging device 1 can be used in various cases where light, such as visible light, infrared light, ultraviolet light, or X-rays, is to be sensed, as listed below, for example.

Devices that capture an image to be provided for viewing, such as a digital camera and a mobile device with a camera function Devices used for traffic, such as in-vehicle sensors that capture images of the front, rear, surroundings, interior, or the like of vehicles for safe driving including automatic stop and the like and recognition of the driver's condition, monitoring cameras for monitoring traveling vehicles and roads, and ranging sensors that measure distance, for example between vehicles Devices used for home appliances, such as TVs, refrigerators, and air conditioners, for capturing images of user's gestures and performing device operations in accordance with the gestures Devices used for medical and healthcare, such as endoscopes and instruments that perform angiography by receiving infrared light Devices used for security, such as security surveillance cameras and personal authentication cameras Devices used for beauty, such as skin measuring instruments for capturing images of skin and microscopes for capturing images of scalp Devices used for sports and the like, such as action cameras and wearable cameras for sports application Devices used for agriculture, such as cameras for monitoring condition of farms or crops <11. Examples of Practical use for Mobile Objects>

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 17:
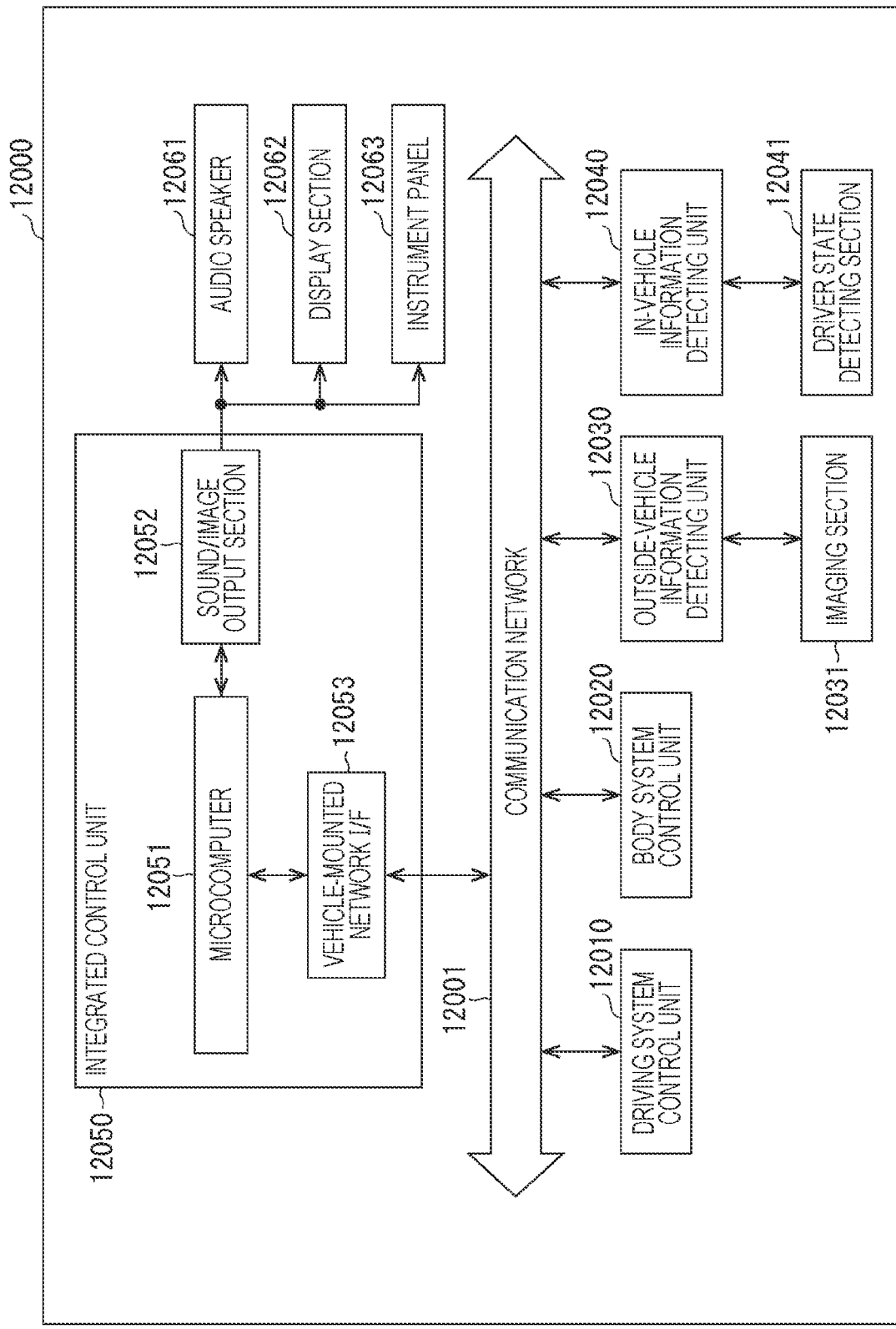
FIG. 17 is a block diagram illustrating an example of a schematic configuration of a vehicle control system.

FIG. 17 is a block diagram illustrating a schematic configuration example of a vehicle control system which is an example of a mobile object control system to which a technology according to an embodiment of the present technology is applicable.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, a vehicle-mounted network interface (I/F) 12053.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electrical signal corresponding to a received light amount of the light. The imaging section 12031 can output the electrical signal as an image, or can output the electrical signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 17, an audio speaker 12061, a display unit 12062, and an instrument panel 12063 are exemplified as the output device. The display unit 12062 may, for example, include at least one of an on-board display or a head-up display.

Figure 18:
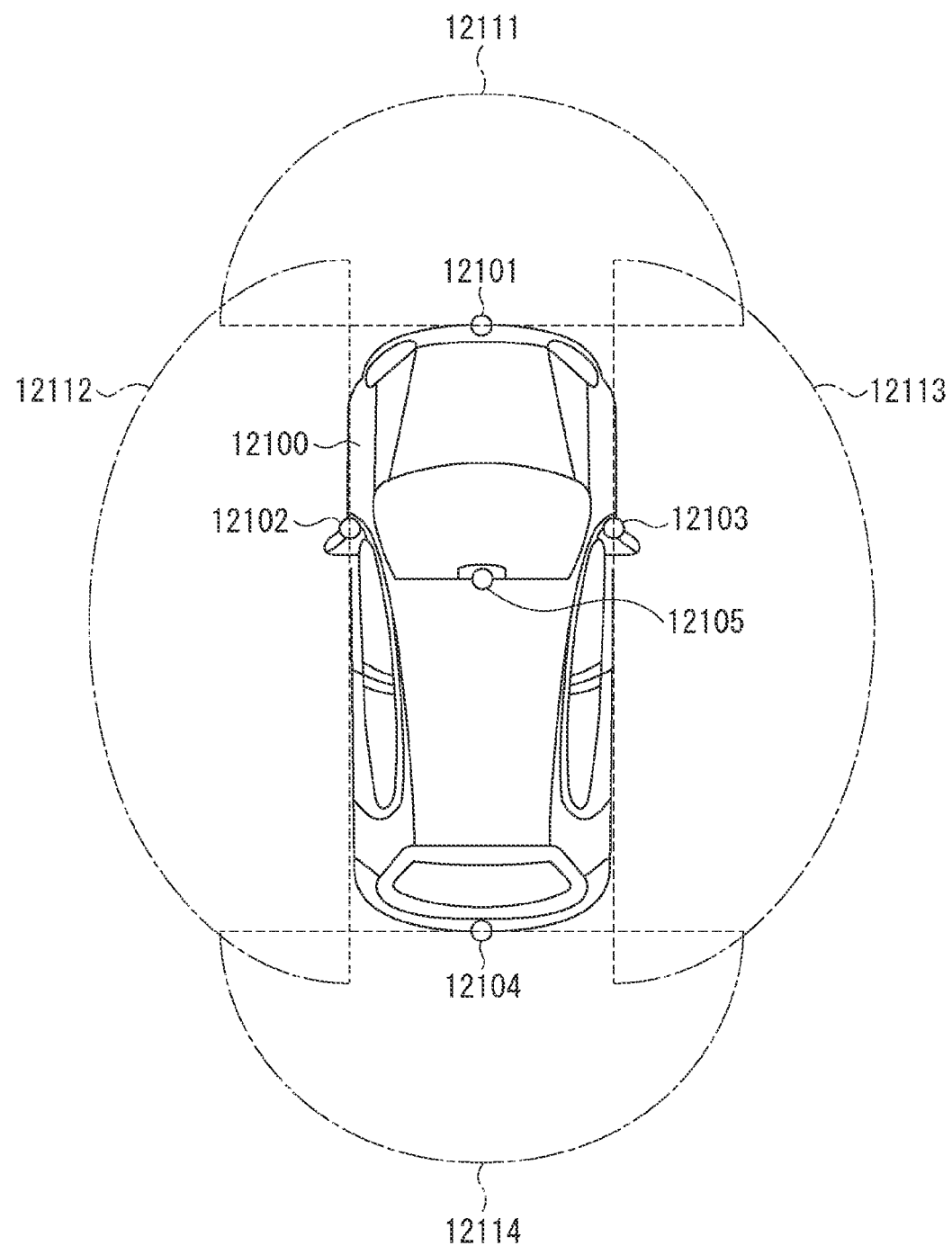
FIG. 18 is an explanatory diagram illustrating an example of installation positions of an outside-vehicle information detecting unit and the imaging section.

FIG. 18 is a diagram illustrating an example of an installation position of the imaging section 12031.

In FIG. 18, a vehicle 12100 includes imaging units 12101, 12102, 12103, 12104, and 12105 as the imaging section 12031.

Imaging sections 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging section 12101 provided to the front nose and the imaging section 12105 provided to the upper portion of the windshield within the interior of the vehicle obtain mainly an image of the front of the vehicle 12100. The imaging sections 12102 and 12103 attached to the side mirrors chiefly acquire images of the areas on the sides of the vehicle 12100. The imaging section 12104 provided to the rear bumper or the back door obtains mainly an image of the rear of the vehicle 12100. The image of the front of the vehicle obtained by the imaging sections 12101 and 12105 is used mainly to detect a preceding vehicle, a pedestrian, an obstacle, a signal, a traffic sign, a lane, or the like.

Additionally, FIG. 18 illustrates an example of the imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/h). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display unit 12062 so that a square contour line for emphasis is displayed so as to be superimposed on the recognized pedestrian. Further, the sound/image output section 12052 may also control the display unit 12062 so that an icon or the like representing the pedestrian is displayed at a desired position.

The exemplary vehicle control system to which the technology according to the present disclosure is applicable is described above. The technology according to the present disclosure can be applied to the imaging section 12031 within the above-described configuration. Specifically, as the imaging section 12031, the solid-state imaging device 1 according to embodiments described above can be applied. By applying the technology according to the present disclosure to the imaging section 12031, it is possible to achieve high dynamic range imaging. In addition, using obtained image, it is possible to reduce the fatigue of a driver, and to improve the safety of the driver and a vehicle.

The present technology can also be applied not only to solid-state imaging devices that sense an incident light quantity distribution of visible light and form an image in accordance with the distribution, but also to solid-state imaging devices (physical quantity distribution sensors) in general, such as a solid-state imaging device that senses an incident quantity distribution of infrared rays, X-rays, particles, or the like, and forms an image in accordance with the distribution, or a fingerprint sensor that senses a distribution of some other physical quantity in a broad sense, such as pressure or capacitance, and forms an image in accordance with the distribution.

Embodiments of the present technology are not limited to the above described embodiments, and various modifications can be made to them without departing from the scope of the present technology.

For example, it is possible to adapt a whole or a part of a plurality of embodiments described above.

Note that the advantageous effects described in the present specification are merely examples and are not limitative, and other advantageous effects than those described in the present specification may be achieved.

Additionally, the present technology may also be configured as below.

(1)

A solid-state imaging device including:

a pixel having a photodiode that performs photoelectric conversion on incident light; and a driving control unit configured to control driving of the pixel, in which the pixel stores a first charge generated by the photoelectric conversion in the photodiode and stores a second charge generated by the photoelectric conversion in a first capacitor provided in a pixel separation portion, and the driving control unit causes a pixel signal due to the second charge stored in the first capacitor to be output and then a pixel signal due to the first charge stored in the photodiode to be output.

(2)

The solid-state imaging device according to (1), in which a semiconductor region on one side of a PN junction of the photodiode constitutes one electrode of the first capacitor, and the pixel further includes a floating diffusion that temporarily holds a charge being output out of the pixel, and a second capacitor between the floating diffusion and the semiconductor region.

(3)

The solid-state imaging device according to (2), in which the second capacitor has capacitance set between 0.2 times and 0.8 times total capacitance of the floating diffusion.

(4)

The solid-state imaging device according to any one of (1) to (3), in which the pixel further includes a transistor that resets the semiconductor region to a fixed potential in outputting the pixel signal due to the second charge stored in the semiconductor region, and the transistor is constituted with a PMOS transistor in a case where the second charge is a hole and is constituted with an NMOS transistor in a case where the second charge is an electron.

(5)

The solid-state imaging device according to (4), in which the transistor has a source region constituted with the semiconductor region.

(6)

The solid-state imaging device according to (4) or (5), in which the transistor has a drain region surrounded by a well, a gate electrode, and the pixel separation portion in plan view and has a structure insulated and separated from the semiconductor region by the well in cross-sectional view.

(7)

The solid-state imaging device according to any one of (4) to (6), in which the transistor is placed at a predetermined corner in the pixel of a rectangular region in plan view.

(8)

The solid-state imaging device according to any one of (1) to (7), in which the driving control unit sets a supply voltage used as a power supply voltage upon a readout operation to a different voltage during a storage period other than the readout operation and a reset operation.

(9)

The solid-state imaging device according to (8), in which the different voltage is 0 V.

(10)

The solid-state imaging device according to (8) or (9), in which the pixel further includes a transistor that resets the semiconductor region to a fixed potential in outputting the pixel signal due to the second charge stored in the semiconductor region, and the driving control unit sets the different voltage higher than the fixed potential by an amount of potential change that varies with a number of saturated charges storable in the semiconductor region.

(11)

The solid-state imaging device according to any one of (1) to (10), further including:

a correction processing unit configured to perform correction processing on the pixel signal due to the second charge by subtracting a fixed component calculated using a plurality of frames from the pixel signal due to the second charge in a case where the pixel signal due to the first charge is smaller than a predetermined value.

(12)

The solid-state imaging device according to (11), in which the correction processing unit calculates the fixed component using the pixel signal due to the second charge of the plurality of frames subjected to correction corresponding to storage time and temperature.

(13)

The solid-state imaging device according to any one of (1) to (12), in which the pixel separation portion penetrates a semiconductor substrate to separate adjacent pixels from each other electrically.

(14)

The solid-state imaging device according to (13), in which the pixel separation portion includes an electrode of a fixed potential formed with a metal material or polysilicon.

(15)

The solid-state imaging device according to (13), in which a semiconductor region on one side of a PN junction of the photodiode constitutes one electrode of the first capacitor, and the pixel separation portion is formed with a semiconductor region having a conductive type opposite to the semiconductor region, the semiconductor region of opposite polarity being applied with a predetermined voltage.

(16)

A method of driving a solid-state imaging device including a pixel having a photodiode that performs photoelectric conversion on incident light, and a driving control unit configured to control driving of the pixel, the method including:

storing, by the pixel, a first charge generated by the photoelectric conversion in the photodiode and storing a second charge generated by the photoelectric conversion in a first capacitor provided in a pixel separation portion; and causing, by the driving control unit, a pixel signal due to the second charge stored in the first capacitor to be output and then a pixel signal due to the first charge stored in the photodiode to be output.

(17)

An electronic apparatus including a solid-state imaging device including:

a pixel having a photodiode that performs photoelectric conversion on incident light; and a driving control unit configured to control driving of the pixel, in which the pixel stores a first charge generated by the photoelectric conversion in the photodiode and stores a second charge generated by the photoelectric conversion in a first capacitor provided in a pixel separation portion, and the driving control unit causes a pixel signal due to the second charge stored in the first capacitor to be output and then a pixel signal due to the first charge stored in the photodiode to be output.

REFERENCE SIGNS LIST

1 Solid-state imaging device
2 Pixel
3 Pixel array section
4 Vertical driver
5 Column signal processing circuit
7 Signal processing circuit
PD Photodiode
FD Floating diffusion
MT Transfer transistor
MA Amplification transistor
MC Switching transistor
MP Ground reset transistor
MR1 First reset transistor
MR2 Second reset transistor
MS Selection transistor
PG Pixel ground region
CP1 First capacitor
CP2 Second capacitor
60 Trench isolation
61 Trench electrode
62 Insulating film
63 N-type semiconductor region
63b Second N-type semiconductor region
64b Second P-type semiconductor region
69 Well
100 Pixel array signal output unit
111 Dark current correction processing unit
141 N-type semiconductor region
142 N-type semiconductor region
200 Imaging device
202 Solid-state imaging device

The invention claimed is:

1. A solid-state imaging device, comprising:
a pixel that includes a first capacitor, a first semiconductor region, a floating diffusion, a second capacitor, and a photodiode, wherein
the first semiconductor region is on a side of a PN junction of the photodiode,
the first capacitor is in a pixel separation portion of the solid-state imaging device,
the second capacitor is between the floating diffusion and the first semiconductor region,
the second capacitor has capacitance between 0.2 times capacitance of the floating diffusion and 0.8 times capacitance of the floating diffusion,
the photodiode is configured to perform photoelectric conversion on incident light to generate a first charge and a second charge,
the pixel is configured to:
store the first charge in the photodiode; and
store the second charge in the first capacitor,
the photodiode is further configured to transfer the stored first charge to the floating diffusion via the first semiconductor region, and
the floating diffusion is configured to temporarily hold the transferred first charge based on the second capacitor; and
circuitry configured to:
cause a first pixel signal to be output from the pixel, wherein the first pixel signal is associated with stored second charge; and
cause, after the first pixel signal is output from the pixel, a second pixel signal to be output from the pixel, wherein the second pixel signal is associated with the temporarily held first charge.

2. The solid-state imaging device according to claim 1, wherein
the first semiconductor region includes an electrode of the first capacitor.

3. The solid-state imaging device according to claim 1, wherein
the pixel further includes a transistor configured to reset the first semiconductor region to output the second pixel signal,
the first semiconductor region is reset to a specific potential,
the transistor corresponds to a PMOS transistor based on the second charge is a hole, and
the transistor corresponds to an NMOS transistor based on the second charge is an electron.

4. The solid-state imaging device according to claim 3, wherein a source region of the transistor includes the first semiconductor region.

5. The solid-state imaging device according to claim 3, wherein
the pixel further includes a well,
the transistor includes a drain region in a plan view of the transistor, a gate electrode in the plan view, and the pixel separation portion in the plan view,
the drain region is surrounded by the well, and
a structure of the transistor is insulated and separated from the first semiconductor region by the well in a cross-sectional view of the transistor.

6. The solid-state imaging device according to claim 3, wherein the transistor is at a specific corner in a rectangular region of the pixel in a plan view of the transistor.

7. The solid-state imaging device according to claim 1, wherein the circuitry is further configured to:
set a supply voltage as a power supply voltage based on a readout operation,
set the supply voltage to a voltage different from the power supply voltage during a storage period, and
the storage period is different from a readout operation period of the readout operation and a reset operation period.

8. The solid-state imaging device according to claim 7, wherein the voltage is 0 V.

9. The solid-state imaging device according to claim 7, wherein
the pixel further includes a transistor configured to reset the first semiconductor region to output the second pixel signal,
the first semiconductor region is reset to a specific potential,
the circuitry is further configured set the voltage higher than the specific potential based on a change in amount of potential of the first semiconductor region, and
the amount of the potential is associated with a number of saturated charges storable in the first semiconductor region.

10. The solid-state imaging device according to claim 1, wherein
the circuitry is further configured to perform correction processing on the first pixel signal based on the second pixel signal and subtraction of a fixed component from the first pixel signal,
the fixed component is associated with a plurality of frames, and
the first pixel signal is smaller than a specific value.

11. The solid-state imaging device according to claim 10, wherein
the circuitry is further configured to calculate the fixed component based on the first pixel signal, and
the plurality of frames is associated with correction corresponding to storage time and temperature.

12. The solid-state imaging device according to claim 1, wherein
the pixel separation portion penetrates a semiconductor substrate to electrically separate adjacent pixels of a plurality of pixels, and
the plurality of pixels includes the pixel.

13. The solid-state imaging device according to claim 12, wherein
the pixel separation portion includes an electrode of a specific potential, and
the electrode includes one of a metal material or polysilicon.

14. The solid-state imaging device according to claim 12, wherein
the first semiconductor region includes an electrode of the first capacitor,
the pixel separation portion includes a second semiconductor region,
a conductive state of the first semiconductor region is opposite to a conductive state of the second semiconductor region,
the second semiconductor region and the first semiconductor region are opposite polarity, and
the second semiconductor region is associated with a specific voltage.

15. A method to drive a solid-state imaging device, the method comprising:
in the solid-state imaging device that includes a pixel and circuitry, wherein
the pixel includes a first capacitor, a semiconductor region, a floating diffusion, a second capacitor, and a photodiode, the semiconductor region is on a side of a PN junction of the photodiode, the first capacitor is in a pixel separation portion of the solid-state imaging device, a second capacitor is between the floating diffusion and the semiconductor region, and the second capacitor has capacitance between 0.2 times capacitance of the floating diffusion and 0.8 times capacitance of the floating diffusion:
performing, by the photodiode, photoelectric conversion on incident light to generate a first charge and a second charge;
storing, by the pixel, the first charge in the photodiode;
storing, by the pixel, the second charge in the first capacitor;
transferring, by the photodiode, the stored first charge to the floating diffusion via the semiconductor region;
temporarily holding, by the floating diffusion, the transferred first charge based on the second capacitor;
causing, by the circuitry, a first pixel signal to be output from the pixel, wherein the first pixel signal is associated with the stored second charge; and
causing, after the first pixel signal is output from the pixel, a second pixel signal to be output from the pixel, wherein the second pixel signal is associated with the temporarily held first charge.

16. An electronic apparatus, comprising:
a solid-state imaging device that includes:
a pixel that includes a first capacitor, a semiconductor region, a floating diffusion, a second capacitor, and a photodiode, wherein
the semiconductor region is on a side of a PN junction of the photodiode,
the first capacitor is in a pixel separation portion of the solid-state imaging device,
the second capacitor is between the floating diffusion and the semiconductor region,
the second capacitor has capacitance between 0.2 times capacitance of the floating diffusion and 0.8 times capacitance of the floating diffusion,
the photodiode is configured to perform photoelectric conversion on incident light to generate a first charge and a second charge,
the pixel is configured to store the first charge in the photodiode,
the pixel is configured to store the second charge in the first capacitor,
the photodiode is further configured to transfer the stored first charge to the floating diffusion via the semiconductor region, and
the floating diffusion is configured to temporarily hold the transferred first charge based on the second capacitor; and
circuitry configured to:
cause a first pixel signal to be output from the pixel, wherein the first pixel signal is associated with the stored second charge; and
cause, after the first pixel signal is output from the pixel, a second pixel signal to be output from the pixel, wherein the second pixel signal is associated with the temporarily held first charge.

17. A solid-state imaging device, comprising:
circuitry; and
a pixel that includes a first capacitor, a semiconductor region, a transistor, and a photodiode, wherein
the semiconductor region is connected to the first capacitor,
the first capacitor is in a pixel separation portion of the solid-state imaging device,
the photodiode is configured to perform photoelectric conversion on incident light to generate a first charge and a second charge,
during a storage charge period:
the pixel is configured to:
store the first charge in the photodiode; and
store the second charge in the first capacitor;
the circuitry is configured to set a supply voltage to a voltage, wherein the supply voltage corresponds to a voltage supplied to the pixel, during a readout operation period of a first pixel signal:
the circuitry is further configured to set the voltage higher than a specific potential based on a change in amount of potential of the semiconductor region, wherein
the amount of the potential is associated with a number of saturated charges storable in the semiconductor region,
the number of saturated charges is associated with the second charge, and
the reset transistor reset the semiconductor region; and
cause the first pixel signal to be output from the pixel based on the reset of the semiconductor region, wherein the first pixel signal is associated with the stored second charge, and
during a readout operation period of a second pixel signal:

cause, after the first pixel signal is output from the pixel, the second pixel signal to be output from the pixel, wherein the second pixel signal is associated with the stored first charge.

* * * * *